(12) United States Patent
Hayashi

(10) Patent No.: US 7,114,137 B2
(45) Date of Patent: Sep. 26, 2006

(54) METHOD OF ANALYZING SEMICONDUCTOR LSI CIRCUIT ELECTROSTATIC DISCHARGE

(75) Inventor: Sachio Hayashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 131 days.

(21) Appl. No.: 10/872,179

(22) Filed: Jun. 17, 2004

(65) Prior Publication Data
US 2005/0010879 A1    Jan. 13, 2005

(30) Foreign Application Priority Data
Jun. 18, 2003    (JP)    ............................ P2003-173850

(51) Int. Cl.
    *G06F 17/50*      (2006.01)
(52) U.S. Cl. .................... 716/4; 716/5; 716/10; 716/11
(58) Field of Classification Search .................... 716/4, 716/5, 10, 11
See application file for complete search history.

(56) References Cited

U.S. PATENT DOCUMENTS

| | | | | |
|---|---|---|---|---|
| 5,796,638 | A | * | 8/1998 | Kang et al. .................... 716/5 |
| 6,553,542 | B1 | * | 4/2003 | Ramaswamy et al. ......... 716/2 |
| 2002/0152447 | A1 | * | 10/2002 | Venugopal et al. ............. 716/4 |
| 2004/0243949 | A1 | * | 12/2004 | Wang et al. .................... 716/4 |

OTHER PUBLICATIONS

Li et al., "Layout Extraction and Verification Methodlogy for CMOS I/O Circuits", Proceedings of the 35th annual conference on Design Automation , ACM press, May 1998.*
Hayashi et al., "Full-Chip Analysis Method of ESD Protection Network", Proceedings of the 5th International Symposium on Quality Electronic Design, IEEE Computer Society, Mar. 2004.*
Ngan, et al., "Automatic Layout Based Verification of Electrostatic Discharge Paths," EOS/ESD Symposium, 2A.4.1-2A.4.6, 2001.
Li et al., "Full Chip ESD Design Rule Checking," ISCAS-2001, V-503-V-506, 2001.

* cited by examiner

*Primary Examiner*—Paul Dinh
*Assistant Examiner*—Tuyen To
(74) *Attorney, Agent, or Firm*—DLA Piper Rudnick Gray Cary US LLP

(57) ABSTRACT

An electrostatic discharge analysis method includes extracting the pads from an input layout of the semiconductor integrated circuit; extracting the nets connected to the extracted pads; extracting the protective elements connected to the extracted nets; forming connection nodes that connect the pads or the protective elements to the nets; extracting for each net, distributed resistances that distribute along the net; connecting the distributed resistances to the connection nodes in place of the nets; forming inter-resistance nodes between the distributed resistances; and calculating an inter-pad voltage when flowing electrostatic discharge current between the pads.

13 Claims, 41 Drawing Sheets

FIG. 14

| TRANSISTOR NAME | NODE NAME FOR NODE WITH ALMOST THE SAME POTENTIAL AS THE GATE POTENTIAL | NODE NAME FOR NODE WITH AMLOST THE SAME POTENTIAL AS THE SOURCE/DRAIN POTENTIAL | |
|---|---|---|---|
| M1 | nC | nB | ⎫ |
|  | nC | nD | ⎬ 64 |
|  | nA | nD |  |
|  | nA | nB | ⎭ |
| M2 | nC | nB | ⎫ |
|  | nC | nD | ⎬ 65 |
|  | nA | nD |  |
|  | nA | nB | ⎭ |
| M3 | nF | nE | ⎫ 66 |
|  | nF | nH | ⎭ |
| M4 | nG | nH | ⎫ 67 |
|  | nG | nE | ⎭ |

| | | | | |
|---|---|---|---|---|
|PAD_1|(VDDC)|PAD_2|(VDDC)|2.71899|
|PAD_1|(VDDC)|PAD_4|(PAD_4)|7.31121|
|PAD_1|(VDDC)|PAD_5|(PAD_5)|7.96897|
|PAD_1|(VDDC)|PAD_6|(PAD_6)|7.96897|
|PAD_1|(VDDC)|PAD_113|(PAD_113)|31.7851|
|PAD_1|(VDDC)|PAD_124|(VSPBIAS)|22.9497|
|PAD_1|(VDDC)|PAD_125|(VDAI)|25.3167|
|PAD_1|(VDDC)|PAD_126|(PAD_126)|33.9891|
|PAD_1|(VDDC)|PAD_127|(VDAI)|25.2206|
|PAD_1|(VDDC)|PAD_128|(PAD_128)|34.9216|
|PAD_1|(VDDC)|PAD_188|(VSIFR)|12.6163|
|PAD_1|(VDDC)|PAD_189|(VDIFR)|14.0584|
|PAD_1|(VDDC)|PAD_221|(PAD_221)|10.0863|
|PAD_1|(VDDC)|PAD_222|(PAD_222)|10.7441|
|PAD_1|(VDDC)|PAD_223|(PAD_223)|10.1619|
|PAD_1|(VDDC)|PAD_224|(PAD_224)|10.7441|
|PAD_1|(VDDC)|PAD_237|(PAD_237)|9.53818|
|PAD_1|(VDDC)|PAD_239|(VSS)|6.41979|
|PAD_1|(VDDC)|PAD_240|(VSS)|6.43635|
|PAD_2|(VDDC)|PAD_1|(VDDC)|2.71899|
|PAD_2|(VDDC)|PAD_4|(PAD_4)|8.67684|
|PAD_2|(VDDC)|PAD_5|(PAD_5)|9.3346|
|PAD_2|(VDDC)|PAD_6|(PAD_6)|9.3346|
|PAD_2|(VDDC)|PAD_113|(PAD_113)|33.3841|
|PAD_2|(VDDC)|PAD_124|(VSPBIAS)|24.5486|
|PAD_2|(VDDC)|PAD_125|(VDAI)|26.9156|
|PAD_2|(VDDC)|PAD_126|(PAD_126)|35.588|
|PAD_2|(VDDC)|PAD_127|(VDAI)|26.8196|
|PAD_2|(VDDC)|PAD_128|(PAD_128)|36.5206|
|PAD_2|(VDDC)|PAD_188|(VSIFR)|14.2153|
|PAD_2|(VDDC)|PAD_189|(VDIFR)|15.6574|
|PAD_2|(VDDC)|PAD_221|(PAD_221)|11.6853|
|PAD_2|(VDDC)|PAD_222|(PAD_222)|12.3431|
|PAD_2|(VDDC)|PAD_223|(PAD_223)|11.7609|
|PAD_2|(VDDC)|PAD_224|(PAD_224)|12.3431|
|PAD_2|(VDDC)|PAD_237|(PAD_237)|11.1372|
|PAD_2|(VDDC)|PAD_239|(VSS)|8.01877|
|PAD_2|(VDDC)|PAD_240|(VSS)|8.03533|
|PAD_4|(PAD_4)|PAD_1|(VDDC)|10.527|
|PAD_4|(PAD_4)|PAD_2|(VDDC)|10.8234|

| INTER-RESISTANCE NODE NAME | CONNECTION NODE POTENTIAL FUNCTION ALLOWING CALCULATION OF NODE POTENTIAL |
|---|---|
| nA | $f_A(V_{N1}, V_{N2} \cdots, V_{Nm})$ |
| nB | $f_B(V_{N1}, V_{N2} \cdots, V_{Nm})$ |
| nC | $f_C(V_{N1}, V_{N2} \cdots, V_{Nm})$ |
| nD | $f_D(V_{N1}, V_{N2} \cdots, V_{Nm})$ |
| nE | $f_E(V_{N1}, V_{N2} \cdots, V_{Nm})$ |
| nF | $f_F(V_{N1}, V_{N2} \cdots, V_{Nm})$ |
| nG | $f_G(V_{N1}, V_{N2} \cdots, V_{Nm})$ |
| nH | $f_H(V_{N1}, V_{N2} \cdots, V_{Nm})$ |

STEP21: CIRCUIT EXTRACTION

STEP22: RESISTANCE EXTRACTION

STEP23: RESISTANCE NETWORK REDUCTION

STEP24: INTER-PAD VOLTAGE ANALYSIS

STEP25: RESISTANCE NETWORK ANALYSIS

FIG. 44

| <Net1> | <NODE1> | <NODE2> | INTERNODAL VOLTAGE |
|---|---|---|---|
| Net1 | N41 | N45 | V1 |
| Net1 | N42 | N45 | V2 |
| Net1 | N43 | N44 | V3 |
| Net2 | N46 | N49 | V4 |
| Net2 | N46 | N50 | V5 |
| Net2 | N47 | N48 | V6 |

|  | NUMBER OF NODE PAIRS | | |
|---|---|---|---|
|  | 100 | 1000 | 10000 |
| CIRCUIT SIMULATION METHOD | 313 | 3147 | 31465 |
| SEVENTH EMBODIMENT | 33 | 44 | 154 |

(UNIT: SECOND)

|  | CHIP 1 | CHIP 2 | CHIP 3 |
|---|---|---|---|
| SHORTEST PATH DETERMINATION METHOD | 256 | 3397 | 5635 |
| SEVENTH EMBODIMENT | 294 | 4506 | 6751 |

(UNIT: SECOND)

METHOD OF ANALYZING SEMICONDUCTOR LSI CIRCUIT ELECTROSTATIC DISCHARGE

CROSS REFERENCE TO RELATED APPLICATIONS

This application is based upon and claims the benefit of priority from prior Japanese Patent Applications No. P2003-173850, filed on Jun. 18, 2003; the entire contents of which are incorporated herein by reference.

BACKGROUND OF THE INVENTION

1. Field of the Invention

The present invention relates to an analysis method for semiconductor large scale integrated (LSI) circuit electrostatic discharge and a program for the same.

2. Description of the Related Art

A shortest path determination method or a convex minimum cost maximum flow analysis has been carried out for a network of protective elements and parasitic resistances extracted from a layout of a semiconductor LSI circuit, in order to analyze semiconductor LSI circuit electrostatic discharge (ESD). Inter-pad voltages and current paths are calculated when electrostatic discharge is applied between pads of semiconductor LSI circuit.

SUMMARY OF THE INVENTION

According to an aspect of the present invention, a computer implemented electrostatic discharge analysis method is provided for a semiconductor LSI circuit with pads, nets electrically connected to the pads, and protective elements electrically connected to the nets. That method includes extracting all of the pads from an input layout of the semiconductor LSI circuit; extracting all of the nets electrically connected to the extracted pads; extracting all of the protective elements electrically connected to the extracted nets; forming connection nodes that connect the pads or the protective elements to the nets; extracting for each net, all of distributed resistances that are distributed along the net; connecting the distributed resistances to the connection nodes in place of the nets; forming inter-resistance nodes between the distributed resistances; and calculating an inter-pad voltage when an electrostatic discharge current flows between the pads.

According to another aspect of the present invention, a computer implemented electrostatic discharge analysis method is provided for a semiconductor LSI circuit with pads, nets electrically connected to the pads, and protective elements electrically connected to the nets. That method includes extracting all of the pads from an input layout of the semiconductor LSI circuit; extracting all of the nets electrically connected to the extracted pads; extracting all of the protective elements electrically connected to the extracted nets; forming connection nodes that connect the pads or the protective elements to the nets; extracting for each net, all distributed resistances that distribute along the net; connecting the distributed resistances to the connection nodes in place of the nets; forming inter-resistance nodes between the distributed resistances; finding a shortest path that allows minimization of the inter-pad voltage when flowing electrostatic discharge current between the pads; removing the protective elements that do not exist along the shortest path; opening up between the connection nodes connected to the removed protective elements; and calculating the node potential of each of the connection nodes and the inter-resistance nodes when flowing the electrostatic discharge current between the pads and using it calculating inter-pad voltage when flowing electrostatic discharge current between the pads.

According to still another aspect of the present invention, a computer implemented electrostatic discharge analysis method is provided for a semiconductor LSI circuit with pads, nets electrically connected to the pads, and protective elements electrically connected to the nets. That method includes extracting all of the pads from an input layout of the semiconductor LSI circuit; extracting all of the nets electrically connected to the extracted pads; extracting all of the protective elements electrically connected to the extracted nets; forming connection nodes that connect the pads or the protective elements to the nets; extracting for each net, all distributed resistances that distribute along the net; connecting the distributed resistances to the connection nodes in place of the nets; forming inter-resistance nodes between the distributed resistances; finding a shortest path that allows minimization of the inter-pad voltage when flowing electrostatic discharge current between the pads; calculating internodal voltages for each net through which the shortest path passes when flowing the electrostatic discharge current between the connection nodes along the shortest path, considering the distributed resistances extracted from the nets; calculating protective element voltages applied to the protective elements for each protective element along the shortest path when flowing the electrostatic discharge current thereto; and summing the internodal voltages and the protective element voltages and using the results calculating an inter-pad voltage when flowing the electrostatic discharge current between the pads.

BRIEF DESCRIPTION OF THE DRAWINGS

FIG. 14 is a table of gate-to-source/drain voltage calculation node information of the first embodiment;

FIG. 19 is a table of inter-pad voltages displayed on the display unit of the first embodiment;

FIG. 21 is a table of gate-to-source/drain voltage calculation node information of the first embodiment;

FIG. 44 is a node pair table;

DETAILED DESCRIPTION OF THE INVENTION

Figure 1:
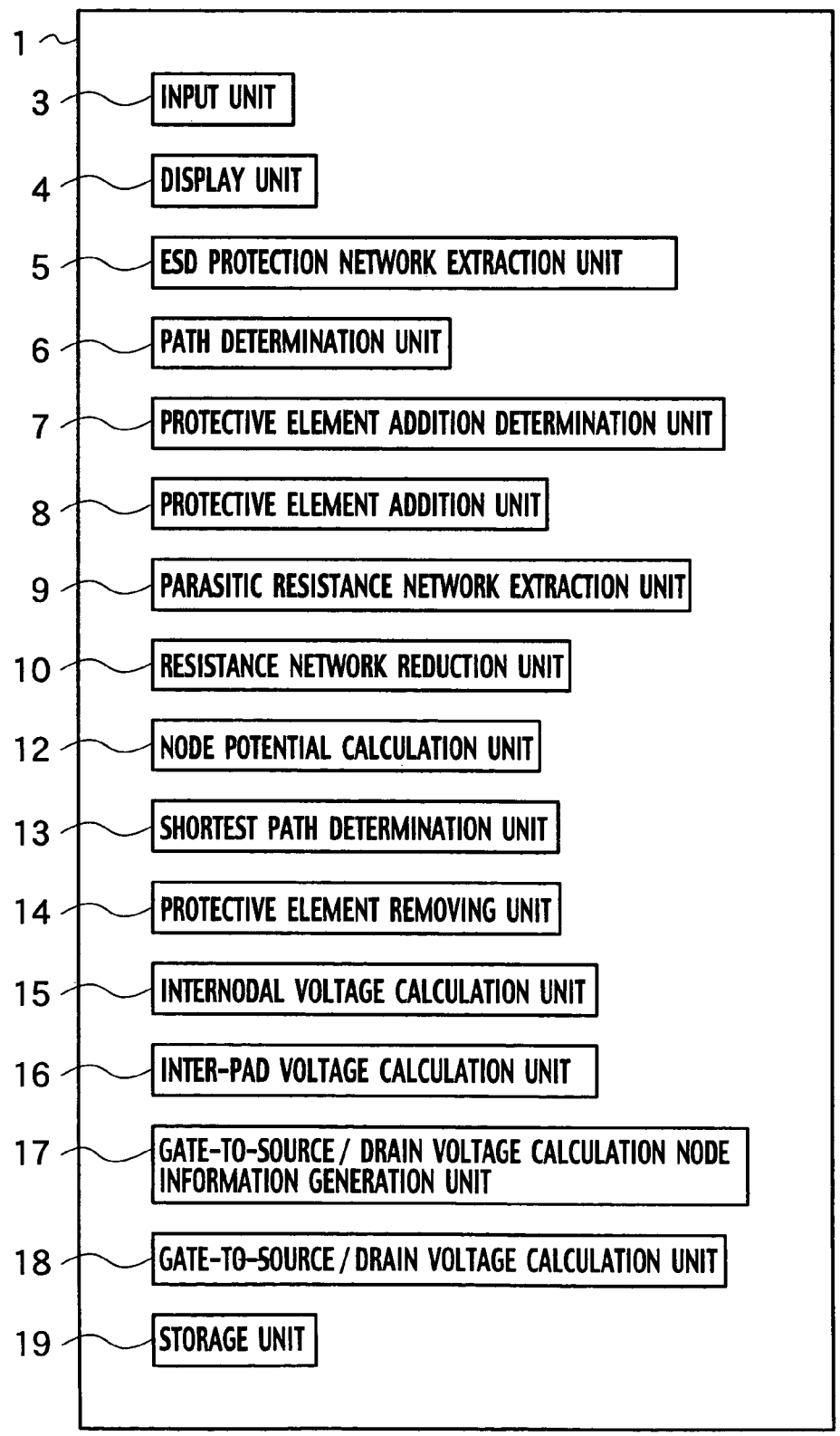
FIG. 1 is a block diagram of an electrostatic discharge analysis apparatus according to an embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

(Shortest Path Determination Method and Convex Minimum Cost Maximum Flow Analysis)

With the shortest path determination method, only one current path is considered. Therefore, there is a problem of overestimation of inter-pad voltages. On the other hand, the convex minimum cost maximum flow analysis allows calculation of inter-pad voltages considering all current paths. However, in this case, there is a possibility that a protective element not normally turned on may be considered as being turned on, resulting in underestimation of the inter-pad voltages.

In addition, with the shortest path determination method and the convex minimum cost maximum flow analysis, the inter-pad voltages are only output to a text file. Therefore, it has been thought that it is difficult to completely understand the analysis results of the inter-pad voltages of a semiconductor LSI circuit.

Furthermore, with the shortest path determination method and the convex minimum cost maximum flow analysis, transistor gate-to-source/drain voltages: of a semiconductor LSI circuit are not calculated when applying electrostatic discharge. Transistor gate-to-source/drain voltages are gate-to-source voltages or gate-to-drain voltages. Therefore, it has been thought that an analysis method for calculating transistor gate-to-source/drain voltages of a semiconductor LSI circuit is necessary when applying electrostatic discharge.

(Electrostatic Discharge Analysis Apparatus)

As shown in FIG. 1, a semiconductor LSI circuit electrostatic discharge analysis apparatus 1, according to an embodiment of the present invention, includes an input unit 3, a display unit 4, an ESD protection network extraction unit 5, a path determination unit 6, a protective element addition determination unit 7, a protective element addition unit 8, a parasitic resistor net extraction unit 9, a resistor net reduction unit 10, a node potential calculation unit 12, a shortest path determination unit 13, a protective element removing unit 14, an internodal voltage calculation unit 15, an inter-pad voltage calculation unit 16, a gate-to-source/drain voltage calculation node information generation unit 17, a gate-to-source/drain voltage calculation unit 18, and a storage unit 19. Functions of these units are described in the description of a semiconductor LSI circuit electrostatic discharge analysis method.

The electrostatic discharge analysis apparatus 1 may be a computer; and the electrostatic discharge analysis apparatus 1 may be implemented by instructing a computer to execute instructions in a program.

(Electrostatic Discharge Analysis Method)

Figure 2:
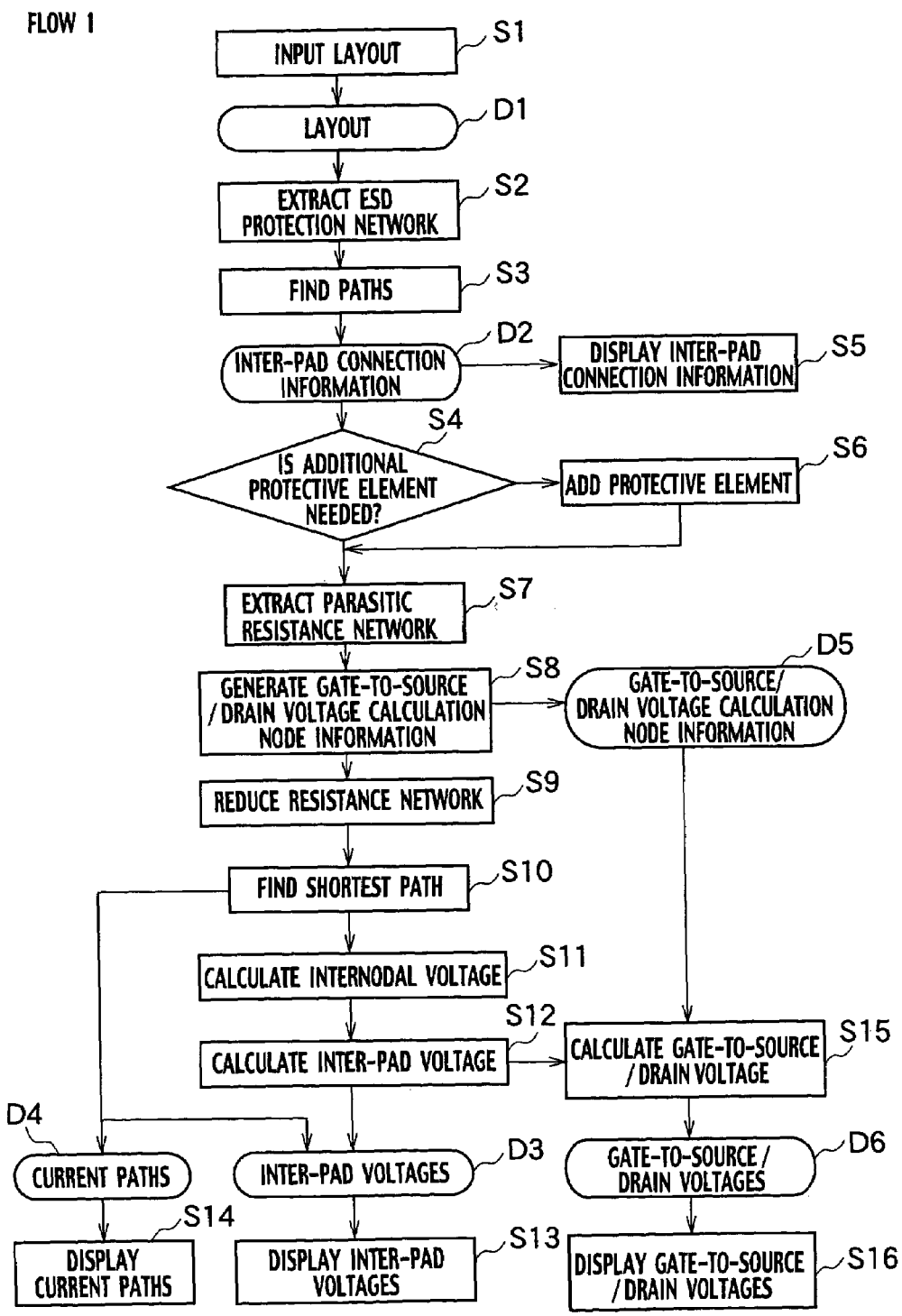
FIG. 2 is a flowchart of an electrostatic discharge analysis method according to an embodiment of the present invention.

As shown in FIG. 2, according to the semiconductor LSI circuit electrostatic discharge analysis method according to the embodiment of the present invention, in step S1, a layout D1 is received from an external memory via the input unit 3.

In step S2, the ESD protection network extraction unit 5 extracts an ESD protection network from the layout D1. The ESD protection network includes all pads included in the layout D1, nets electrically connected to these pads, and protective elements electrically connected to the nets. The pads and/or the protective elements form connection nodes to be connected to the nets.

In step S3, the path determination unit 6 examines whether or not there is an electrostatic discharge path between all pads.

In step S4, the protective element addition determination unit 7 determines whether or not an additional protective element is needed.

In step S5, the display unit 4 arranges and displays identifiers, which identify the existence of a possible electrostatic discharge path, in two-dimensional grids of starting point pads and endpoint pads.

In step S6, the protective element addition unit 8 adds a protective element to form an electrostatic discharge path between pads where no electrostatic discharge path exists.

In step S7, the parasitic resistor net extraction unit 9 extracts all distributed constant parasitic resistances for each net. The distributed resistances are connected to connection nodes instead of the nets. Inter-resistance nodes are then formed between the distributed resistances.

In step S8, the gate-to-source/drain voltage calculation node information generation unit 17 generates first gate-to-source/drain voltage calculation node information D5. The first gate-to-source/drain voltage calculation node information D5 includes a field for identifiers (transistor identifiers) of transistors in which gate-to-source/drain voltages are calculated, a field for identifiers (gate node identifiers) of nodes with a potential equivalent to the gate potential, and a field for identifiers (source/drain node identifiers) of nodes with a potential equivalent to the source or the drain potential (source/drain potential). In addition, the first gate-to-source/drain voltage calculation node information D5 includes associated records which allow retrieval of gate node identifiers of nodes with a potential equivalent to the gate potential and source/drain node identifiers of nodes with a potential equivalent to the source/drain potential from the transistor identifiers. A combination of a gate node identifier of a node with almost the same potential as the transistor gate potential and a source/drain. node identifier of a node with almost the same potential as the transistor source/drain potential can be retrieved. The nodes of the gate node identifiers and source/drain node identifiers, which are listed in the first gate-to-source/drain voltage calculation node information D5, are designated as connection nodes so as to prevent these nodes from being removed by resistor net reduction in step S9.

In step S9, the resistor net reduction unit 10 reduces a resistor net of the distributed resistances extracted from each net. A single reduced resistance is connected between each connection node in place of the distributed resistances so that the combined resistance value between each connection node does not change when each net is freed from protective elements.

In step S10, the shortest path determination unit 13 generates a graph of reduced resistances and protective elements as branches, and determines a shortest path in that graph. Each reduced resistance and each protective element voltage, upon flow of an electrostatic discharge current, is given to each branch as the length of each branch. By determining the shortest path between each pad, the shortest path allowing minimization of the inter-pad voltage is obtained. Summation of the lengths of branches along the shortest path allows calculation of inter-pad voltage D3. The reduced resistances and the protective elements along the shortest path are extracted.

In step S11, for each net through which the shortest path passes, the internodal voltage calculation unit 15 calculates internodal voltages when an electrostatic discharge current flows between the connection nodes along the shortest path, considering all reduced resistances connected to the connection nodes formed in the net. In addition, protective element voltages applied to the extracted protective elements when an electrostatic discharge current flows through those protective elements are calculated.

In step S12, the inter-pad voltage calculation unit 16 calculates the inter-pad voltage D3 by summing the internodal voltages and the protective element voltages. This allows more accurate calculation of the inter-pad voltage D3 than inter-pad voltage D3 calculated in step S10. Note that when calculating the gate-to-source/drain voltages in step S15, the node potential of each node in each net is calculated in step S11 in advance, and the node potential of each node is then calculated by summing the node potentials and the protective element voltages appropriately in step S12.

In step S13, the display unit 4 displays a window on a screen of the display unit 4. The window includes a starting point pad identifier field, a starting point pad connected net identifier field, an endpoint pad identifier field, an endpoint pad connected net identifier field, and a field for calculated inter-pad voltage between the starting point pad and the endpoint pad. In addition, the window includes associated records allowing retrieval of the calculated inter-pad voltage value corresponding to the identifiers of a starting point pad and an endpoint pad.

Furthermore, in step S13, the window includes two-dimensional inter-pad voltage information and identifiers covering respective ranges of inter-pad voltage values. The two-dimensional information allows categorization of all inter-pad voltages according to the identifiers covering respective ranges of inter-pad voltage values. As a result, pads with a sub-standard inter-pad voltage can be easily and quickly determined.

In step S15, the gate-to-source/drain voltage calculation unit 18 retrieves node names corresponding to a gate node identifier and a source/drain node identifier from the transistor names corresponding to respective transistor identifiers based on the first gate-to-source/drain voltage calculation node information D5. The transistor gate-to-source/drain voltage is calculated from the difference between the node potential of a node with a gate node identifier and node potential of a node with a source/drain node identifier.

In step S14, a window is displayed on the screen of the display unit 4. The window includes the layout D1 of a semiconductor LSI circuit. The layout D1 includes multiple pads. A single pad is designated as a starting point pad and another pad is designated as an endpoint pad of multiple pads, and a current path from that starting point pad to that endpoint pad is indicated. The route of the current path is determined based on the shortest path. More specifically, the route of the current path in the layout D1 is determined so as to pass through the reduced resistances and the protective elements along the shortest path. In addition, potential along the current path may be indicated based on the node potential of each node along the shortest path.

In step S16, a window is displayed on the screen of the display unit 4. The window includes the layout D1 of a semiconductor LSI circuit. Symbols ○ and × are displayed at the positions of the transistors of the semiconductor LSI circuit in the layout D1. The symbol ○ indicates that the transistor gate-to-source/drain voltage is lower than the transistor withstand voltage. Therefore, it is apparent that the transistors indicated by the symbol ○ do not fail even if electrostatic discharge current flows from the starting point pad to the endpoint pad. On the other hand, the symbol × indicates that the transistor gate-to-source/drain voltage is greater than the transistor withstand voltage. Therefore, it is apparent that the transistors indicated by the symbol × fail if electrostatic discharge current flows from the starting point pad to the endpoint pad.

The electrostatic discharge analysis method may be implemented using a computer executable semiconductor LSI circuit electrostatic discharge analysis program as instructions. The electrostatic discharge analysis method may be implemented by instructing a computer to execute the electrostatic discharge analyzing program.

As described above, according to the electrostatic discharge analysis method of the embodiment, inter-pad voltages, when applying an electrostatic discharge between pads, may be calculated accurately.

FIRST MODIFIED EXAMPLE

Figure 3:
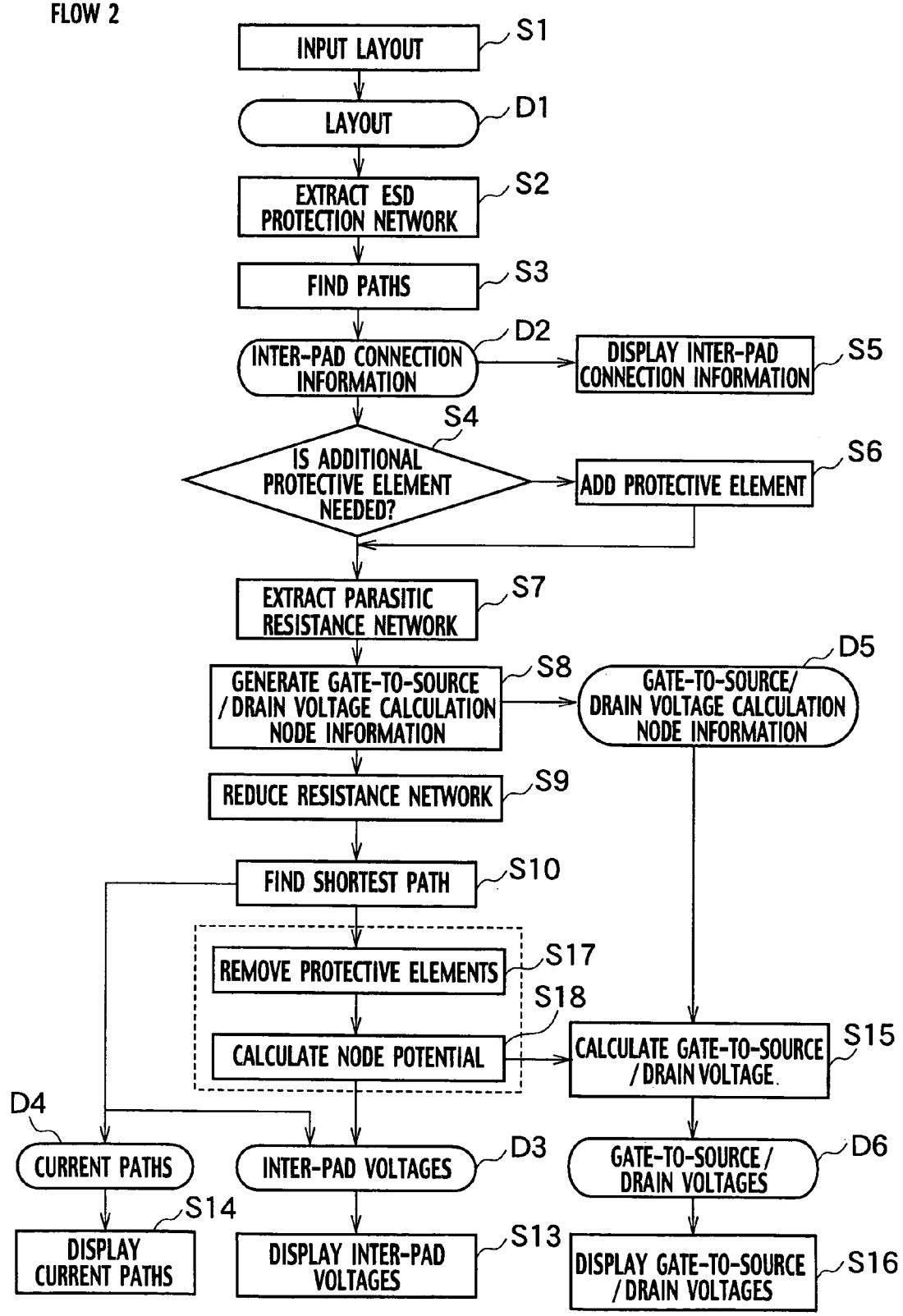
FIG. 3 is a flowchart of an electrostatic discharge analysis method according to a first modified example of the embodiment of the present invention.

As shown in FIG. 3, in a first modified example of the semiconductor LSI circuit electrostatic discharge analysis method, steps S17 and S18 are carried out instead of the steps S11 and S12 according to the electrostatic discharge analysis method in FIG. 2.

In step S17, the protective element removing unit 14 removes protective elements that are not along the shortest path, and opens circuit between the connection nodes connected to the removed protective elements.

In step S18, the node potential calculation unit 12 calculates the node potential of each connection node when an electrostatic discharge current flows between pads.

Note that step S9 may be omitted. In this case, there are no reduced resistances, but only distributed resistances. Therefore, the node potentials of each inter-resistance node and each connection node are calculated.

A potential difference between the node potential of a connection node connected to a starting point pad and node potential of a connection node connected to an endpoint pad is an inter-pad voltage between the starting point pad and the endpoint pad. In addition, in step S15, the gate-to-source/drain voltage may be calculated based on the calculated node potential.

SECOND MODIFIED EXAMPLE

Figure 4:
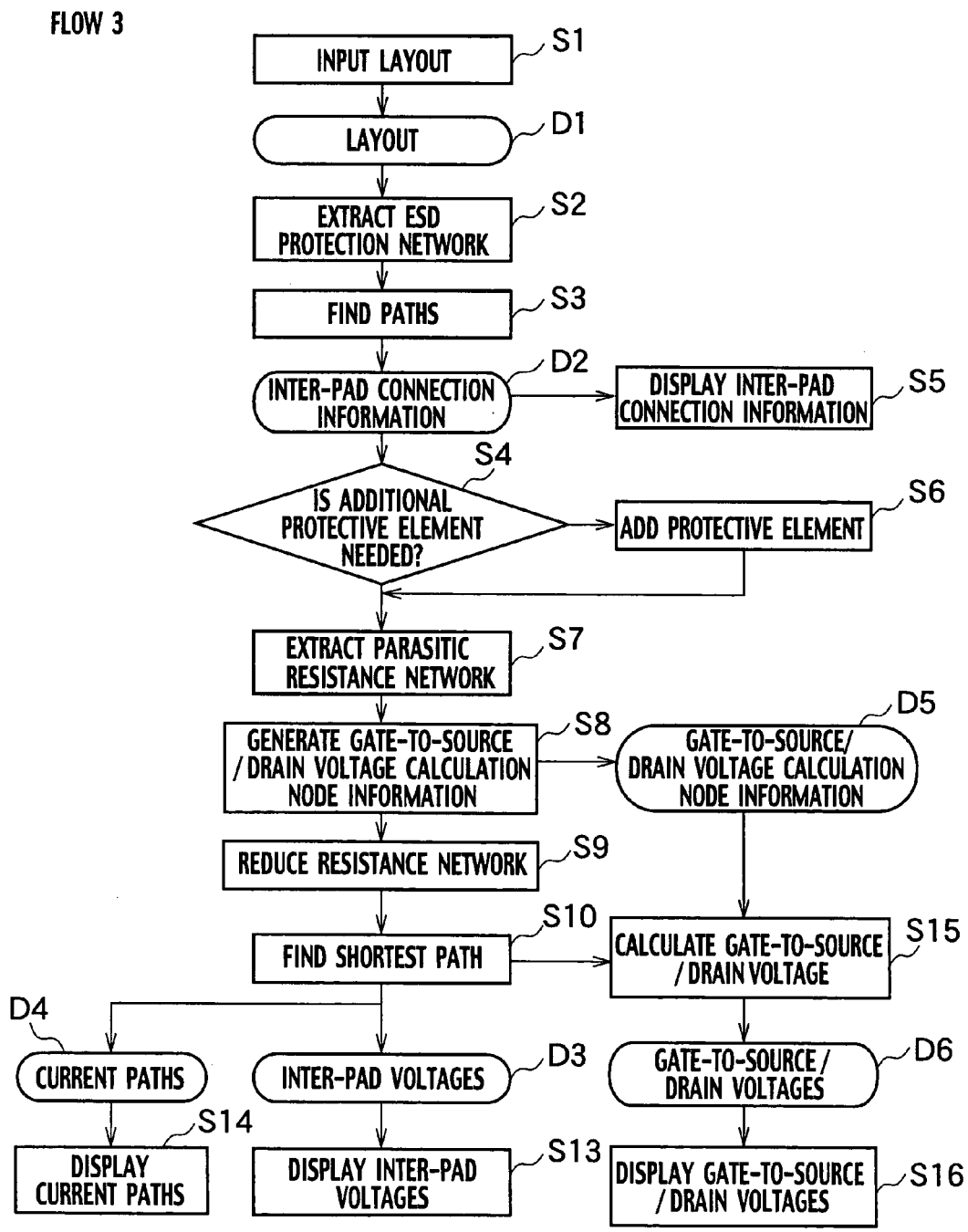
FIG. 4 is a flowchart of an electrostatic discharge analysis method according to a second modified example of the embodiment of the present invention.

As shown in FIG. 4, in a second modified example of the semiconductor LSI circuit electrostatic discharge analysis method, steps S11 and S12 according to the electrostatic discharge analysis method in FIG. 2 are omitted. In other words, steps S17 and S18 according to the first modified example of the electrostatic discharge analysis method in FIG. 3 are omitted. This allows easier calculation of inter-pad voltages than using the electrostatic discharge analysis method in FIG. 2 and the first modified example of the electrostatic discharge analysis method in FIG. 3. However, there is a possibility of overestimation of inter-pad voltages since each inter-pad voltage is calculated considering only one current path.

THIRD MODIFIED EXAMPLE

Figure 5:
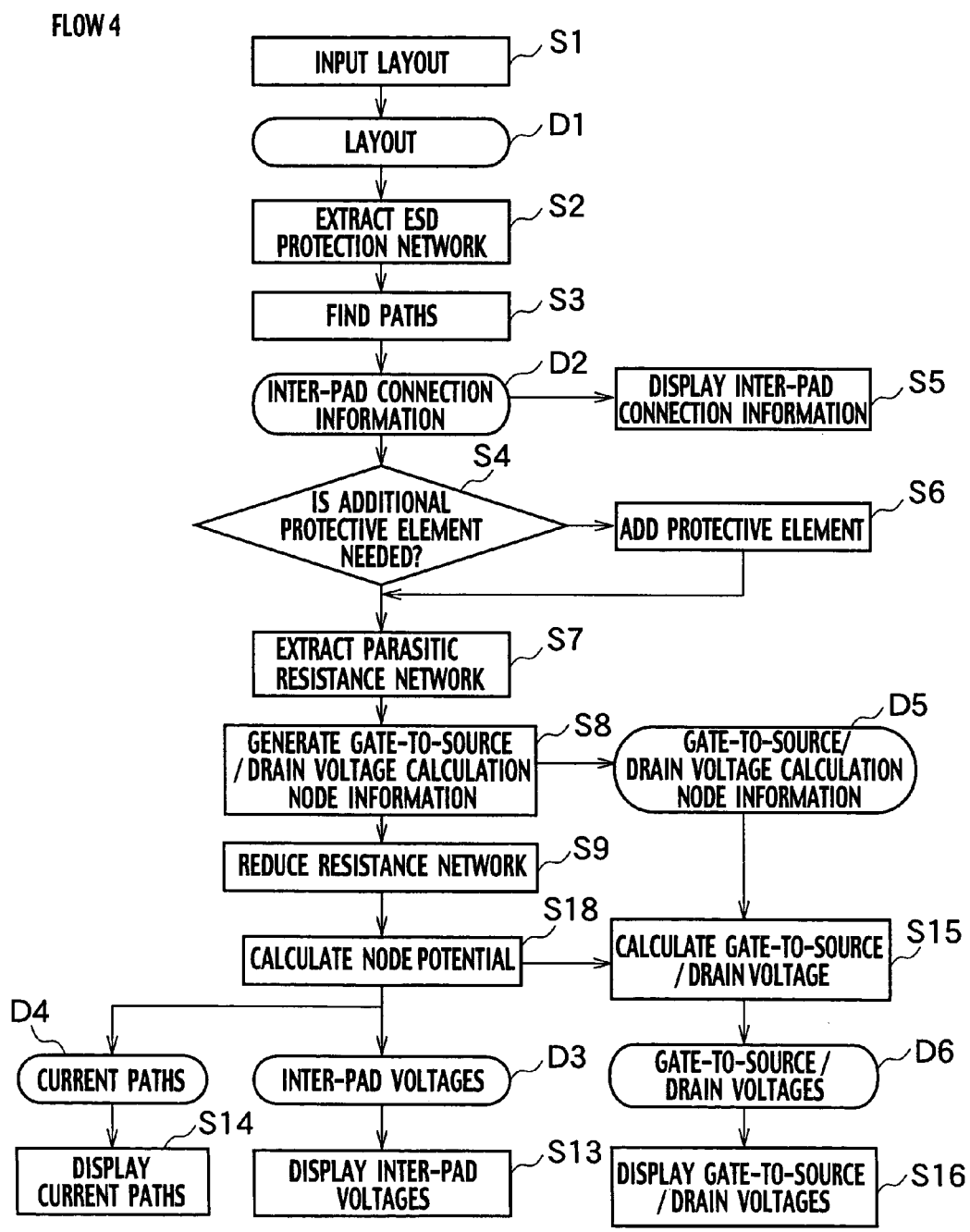
FIG. 5 is a flowchart of an electrostatic discharge analysis method according to a third modified example of the embodiment of the present invention.

As shown in FIG. 5, in a third modified example of the semiconductor LSI circuit electrostatic discharge analysis method, steps S10 and S17 according to the first modified example of the electrostatic discharge analysis method in FIG. 3 are omitted. This allows easier calculation of the inter-pad voltage than using the first modified example of the electrostatic discharge analysis method in FIG. 3. There is a possibility that the protective elements not normally turned on may be considered as being turned on, resulting in underestimation of the inter-pad voltage. In addition, calculation of the inter-pad voltage considering all current paths allows more accurate calculation of the inter-pad voltage than using the second modified example of the electrostatic discharge analysis method in FIG. 4.

FIRST EMBODIMENT

In a first embodiment, the electrostatic discharge analysis apparatus 1 according to the embodiment in FIG. 1 is used.

Figure 6:
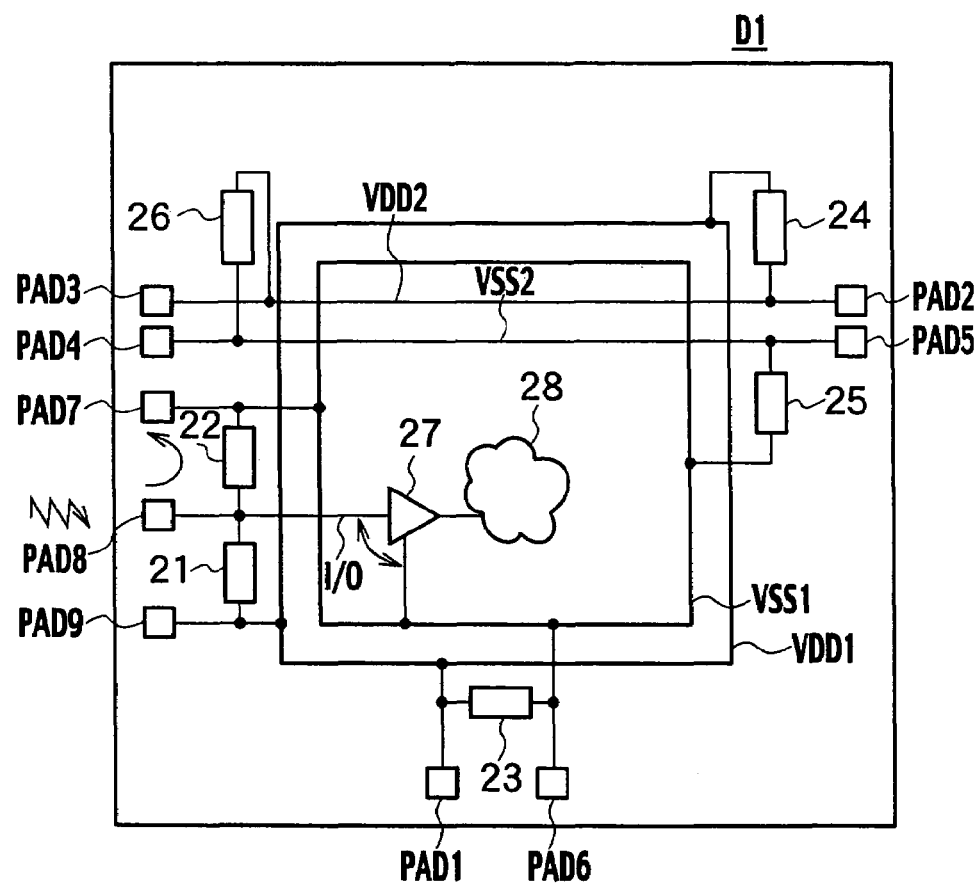
FIG. 6 is a layout of a semiconductor LSI circuit of a first embodiment.

As shown in FIG. 2, using the semiconductor LSI circuit electrostatic discharge analysis method according to the first embodiment of the present invention, in step S1, a layout D1 is received from an external memory. As shown in FIG. 6, the layout D1 includes pads PAD1 to PAD9, nets VDD1, VDD2, VSS1, VSS2, and I/O, and protective elements 21 to 26. The pads PAD1 to PAD9 are electrically connected to the nets VDD1, VDD2, VSS1, VSS2, and I/O. The nets VDD1, VDD2, VSS1, VSS2, and I/O are electrically connected to the protective elements 21 to 26.

For example, when applying electrostatic discharge via the pad PAD8, the potential of the pad PAD8 increases beyond a typical working range. The protective element 22 then makes transition from off to on, current flows through the pad PAD7, and the potential of the pad PAD8 drops. This allows suppression of the inter-terminal voltage of the internal element 27 of the semiconductor LSI circuit below the withstand voltage of the internal element 27.

Figure 7:
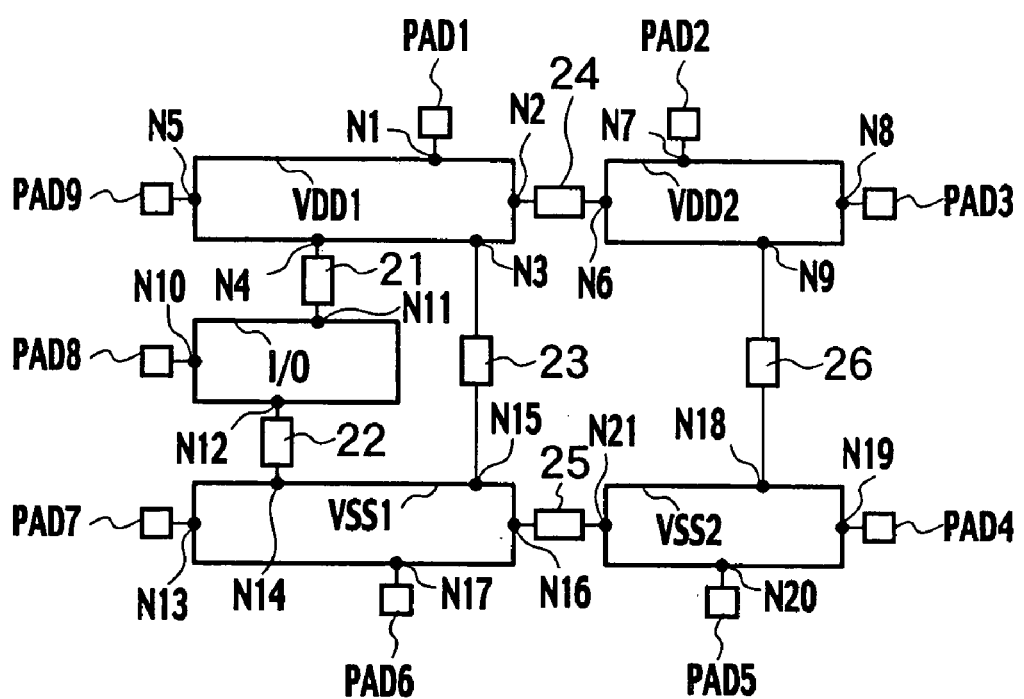
FIG. 7 is a circuit diagram of an ESD protection network made up of pads, nets, and protective elements of the first embodiment.

In step S2, as shown in FIG. 7, the ESD protection network extraction unit 5 extracts all pads PAD1 to PAD9 from the layout D1. In addition, all nets VDD1, VDD2, VSS1, VSS2, and I/O electrically connected to the extracted pads PAD1 to PAD9 are extracted. Moreover, all protective elements 21 to 26 electrically connected to the extracted nets VDD1, VDD2, VSS1, VSS2, and I/O are then extracted. The pads PAD1 to PAD9 and/or the protective elements 21 to 26 configure connection nodes N1 to N21 connected to the nets VDD1, VDD2, VSS1, VSS2, and I/O.

In step S3, the path determination unit 6 examines whether or not there is an electrostatic discharge path between each pad PAD1 to PAD9. For example, when applying electrostatic discharge from the starting point pad PAD3 to the endpoint pad PAD8, there are three electrostatic discharge paths 31 to 33.

Figure 8:
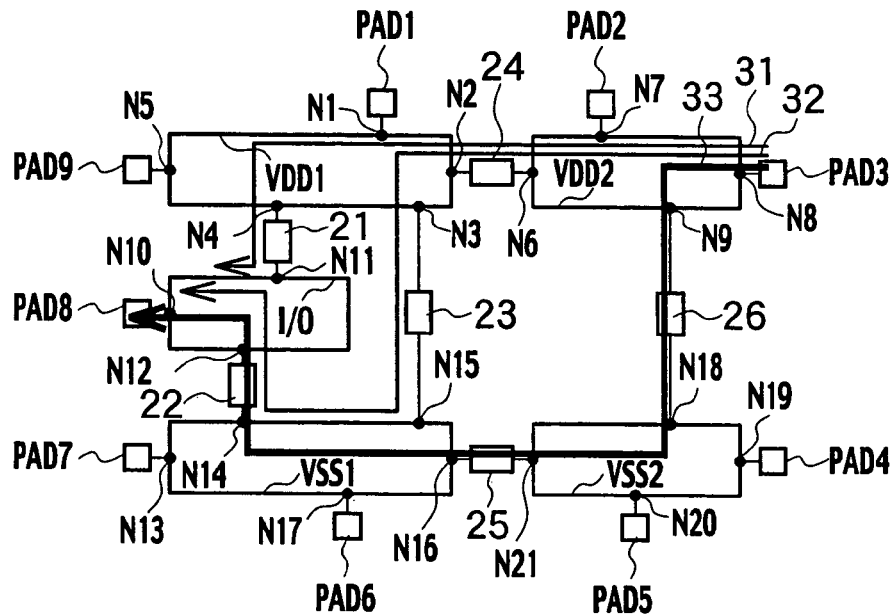
FIG. 8 is a circuit diagram of an ESD protection network of the first embodiment showing a detected possible electrostatic discharge path.

In step S4, the protective element addition determination unit 7 determines that there is an electrostatic path between the starting point pad PAD3 and the endpoint pad PAD8. As shown in FIG. 8, it is apparent that there is an electrostatic discharge path between each pad PAD1 to PAD9. Therefore, it is apparent that additional protective elements are unnecessary.

Figure 9:
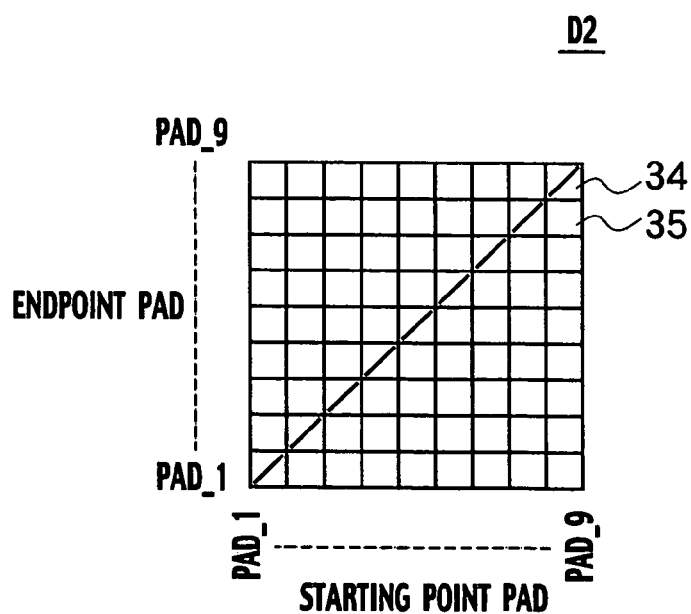
FIG. 9 is a table showing whether there is an electrostatic discharge path displayed as inter-pad connection information on a display unit of the first embodiment.

As shown in FIG. 9, in step S5, the display unit 4 arranges and displays an identifier 35, which identifies a possible electrostatic discharge path, in two-dimensional grids of starting point pads and endpoint pads. As a result, it is apparent from inter-pad connection information D2 that there is an electrostatic discharge path between each pad.

Figure 10:
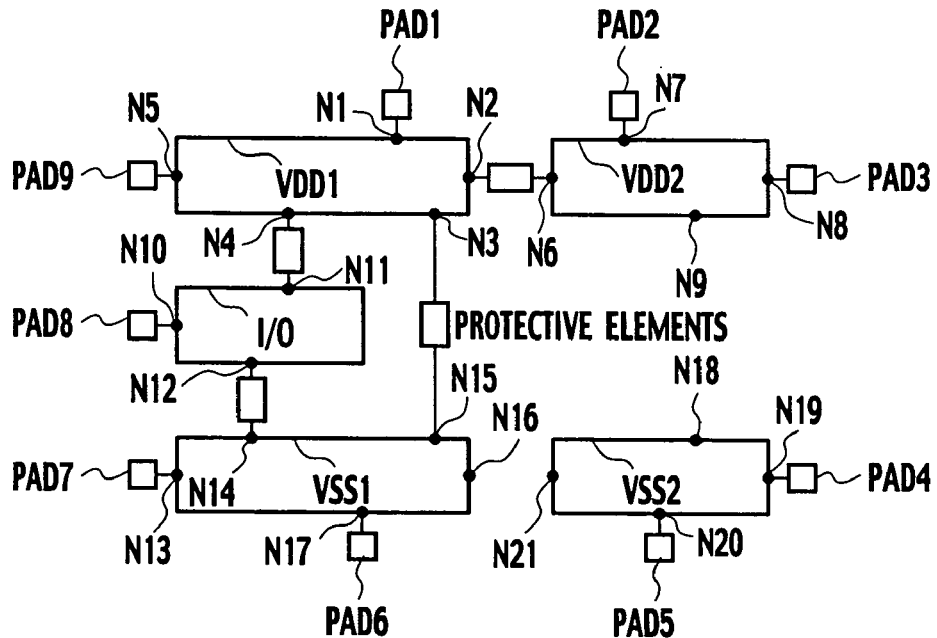
FIG. 10 is a circuit diagram of an ESD protection network not having sufficient protective elements of the first embodiment.
Figure 11:
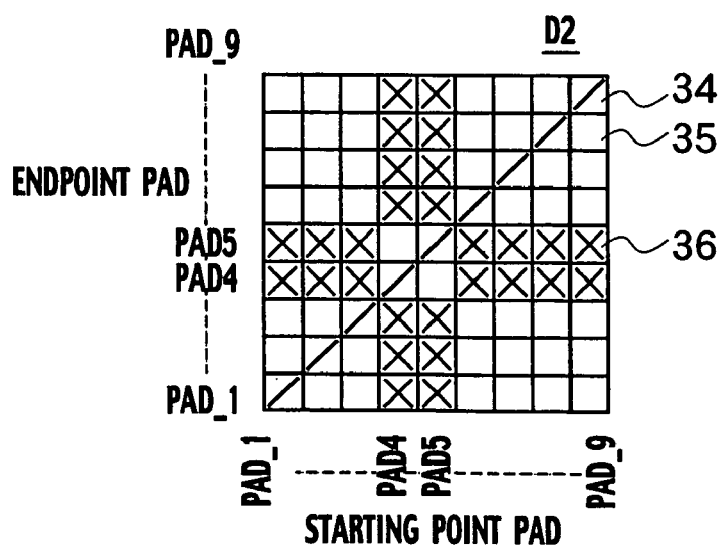
FIG. 11 is an inter-pad connection information table for the ESD protection network not having sufficient protective elements of the first embodiment.

For example, in step S3, whether or not there is an electrostatic discharge path is examined between each pad PAD1 to PAD9 in the ESD protection network as shown in FIG. 10. When applying electrostatic discharge from the starting point pad PAD4 to the endpoint pad PAD1, there is no electrostatic discharge path. In step S4, it is determined that there is no electrostatic discharge path between the starting point pad PAD4 and the endpoint pad PAD1. As shown in FIG. 11, it is determined that there is no electrostatic discharge path between the pad PAD4 and other pads and between the pad PAD5 and other pads. Therefore, it is apparent that additional protective elements are necessary. Arrangement and display of the identifier 36 identifying that there is no electrostatic discharge path in two-dimensional grids of starting point pads and endpoint pads allow easy determination of which pad needs additional protective elements from the inter-pad connection information D2.

In step S6, the protective element addition unit 8 adds a protective element to establish an electrostatic discharge path between pads where an electrostatic discharge path did not previously exist.

Figure 12:
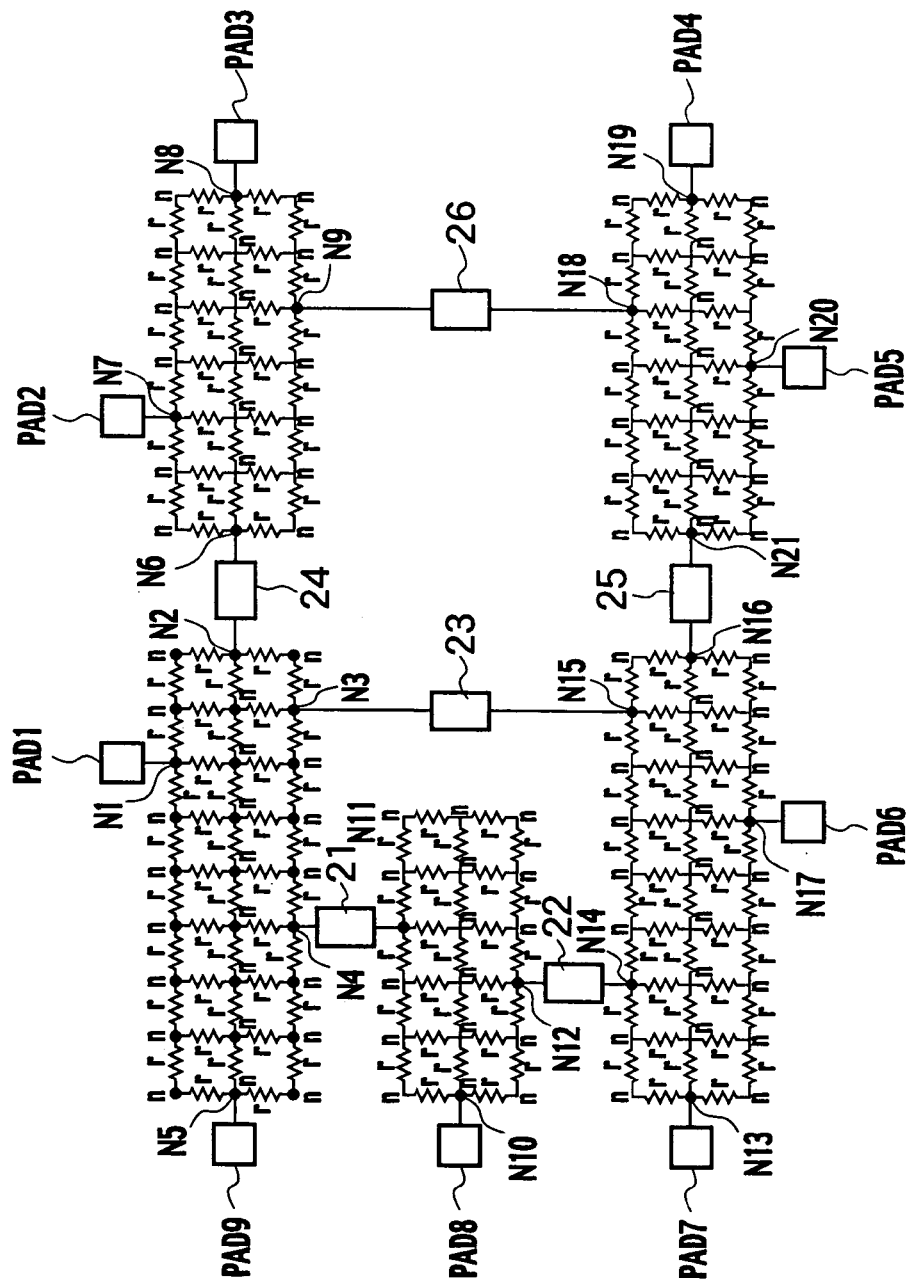
FIG. 12 is a circuit diagram of a parasitic resistor net where the nets of the first embodiment are replaced with the resistor nets made up of distributed resistances.

As shown in FIG. 12, in step S7, the parasitic resistor net extraction unit 9 extracts all distributed resistances r, which are distributed in the nets VDD1, VDD2, VSS1, VSS2, and I/O, for each net. The distributed resistances r are connected to the connection nodes N1 to N21, instead of the nets VDD1, VDD2, VSS1, VSS2, and I/O. Inter-resistance nodes n are formed between the distributed resistances r.

Figure 13A:
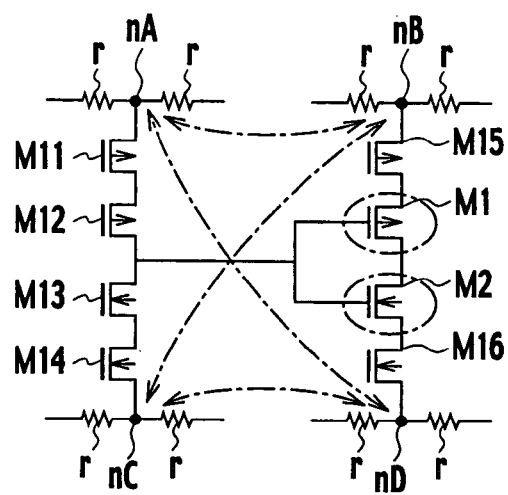
FIGS. 13A and 13B are circuit diagrams of part of a semiconductor LSI circuit to which resistor nets made up of distributed resistances of the first embodiment are connected.
Figure 13B:
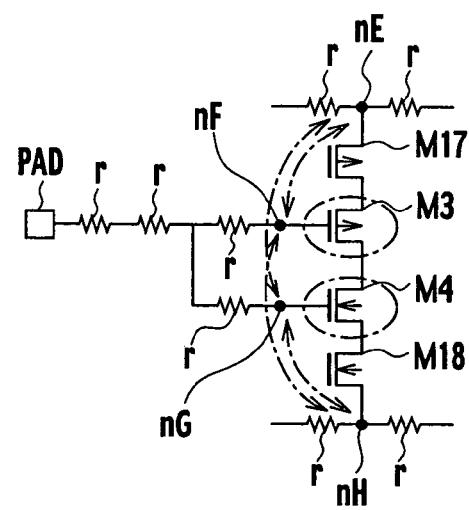

As shown in FIG. 13, resistor nets made up of the distributed resistances r may be connected to the transistors of a semiconductor LSI circuit. This is because the interconnects of a semiconductor LSI circuit have distributed resistances r, and those distributed resistances r are extracted from those interconnects. As shown in FIG. 13A, the source of the transistor M11 and the distributed resistances r are connected to one another at node nA. Similarly, the source of the transistor M14 and the distributed resistances r are connected to one another at node nC. The source of the transistor M15 and the distributed resistances r are connected to one another at node nB. The source of the transistor M16 and the distributed resistances r are connected to one another at node nD. As shown in FIG. 13B, the source of the transistor M17 and the distributed resistances r are connected to one another at node nE. The gate of the transistor M3 and the distributed resistance r are connected to one another at node nF. The gate of the transistor M4 and the distributed resistance r are connected to one another at node nG. The source of the transistor M18 and the distributed resistances r are connected to one another at node nH.

In step S8, the gate-to-source/drain voltage calculation node information generation unit 17 generates first gate-to-source/drain voltage calculation node information D5 as shown in FIG. 14. The first gate-to-source/drain voltage calculation node information D5 includes a field 61 for identifiers (transistor identifiers) of transistors M1 to M4 of which gate-to-source/drain voltages are calculated, a field 62 for identifiers (gate node identifiers) of nodes with almost the same potential as the gate potential, and a field 63 for identifiers (source/drain node identifiers) of nodes with almost the same potential as the source potential or drain potential (source/drain potential). In addition, the first gate-to-source/drain voltage calculation node information D5 includes associated records 64 to 67, which allow retrieval of the gate node identifier of a node with almost the same potential as the gate potential and the source/drain node identifier of a node with almost the same potential as the source/drain potential from the transistor identifiers of the transistors M1 to M4. For example, the gate of the transistor M1 may be connected to the node nA via the transistors M11 and M12, or to the node nC via the transistors M13 and M14; and the source/drain of the transistor M1 may be connected to the node nB via the transistor M15, or to the node nD via the transistors M2 and M16. There are four combinations of the gate node identifier of a node with almost the same potential as the gate potential of the transistor M1 and the source/drain node identifier of a node almost the same potential as the source/drain potential of the transistor M1: (nA, nB), (nA, nD), (nC, nB), and (nC, nD), which can be retrieved from the record 64. The nodes of the gate node identifier and the source/drain node identifier, which are listed in the first gate-to-source/drain voltage calculation node information D5, are specified as connection nodes so that they cannot be removed by resistor net reduction in step S9.

Figure 15:
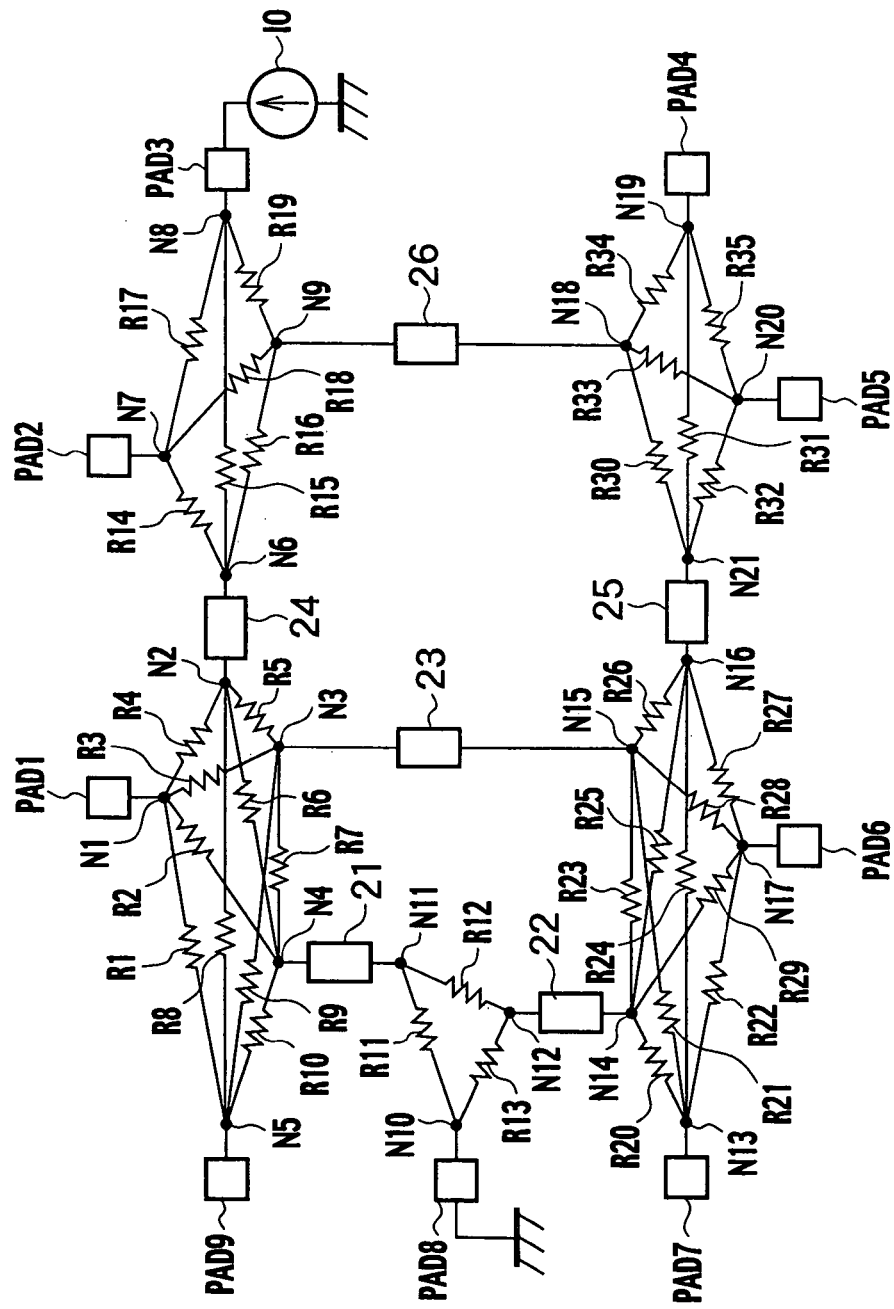
FIG. 15 is a circuit diagram of a reduced resistor net where resistor nets made up of the distributed resistances of the first embodiment are replaced with the resistor nets made up of reduced resistances.

As shown in FIG. 15, in step S9, the resistor net reduction unit 10 connects one of the reduced resistances R1 to R35 instead of the distributed resistances r for each inter-connection node so that the combined resistance value between each connection node N1 to N21 cannot change when the nets VDD1, VDD2, VSS1, VSS2, and I/O are freed of the protective elements 21 to 26, for each net.

Figure 16:
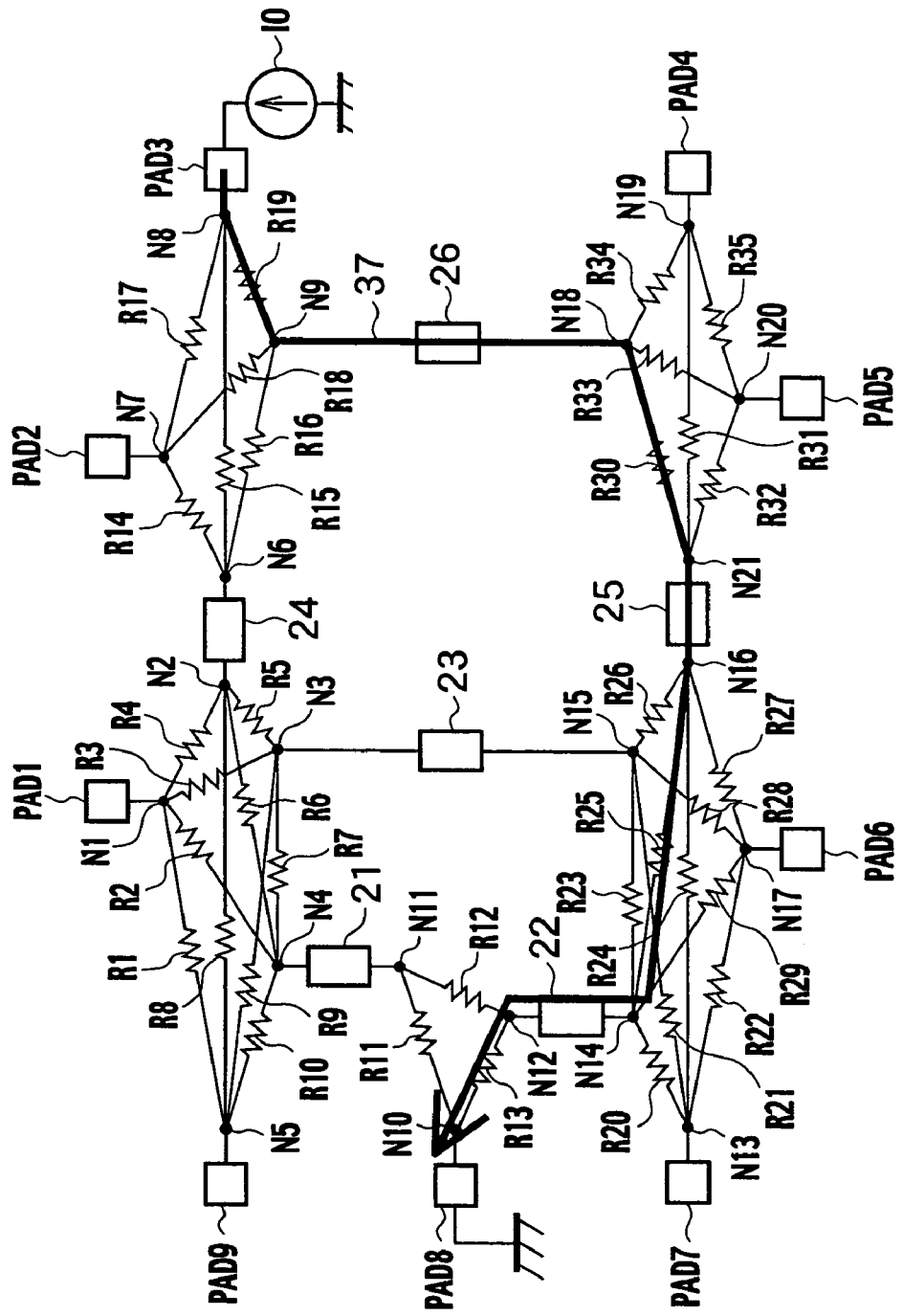
FIG. 16 is a circuit diagram of a reduced resistor net of the first embodiment showing a shortest detected electrostatic discharge path.

In step S10, the shortest path determination unit 13 generates a graph of reduced resistances and protective elements as branches from the circuit in FIG. 15, and determines the shortest path in that graph. By giving each protective element voltage value as the length of each branch when an electrostatic discharge current I0 flows through that branch and determining the shortest path between pads, the shortest path 37 allowing minimization of the inter-pad voltage is obtained as shown in FIG. 16. Summation of the lengths of the branches along the shortest path 37 allows calculation of inter-pad voltage D3. In addition, reduced resistances R19, R30, R25, and R13, and protective elements 26, 25, and 22 along the shortest path 37 are extracted.

Figure 17A:
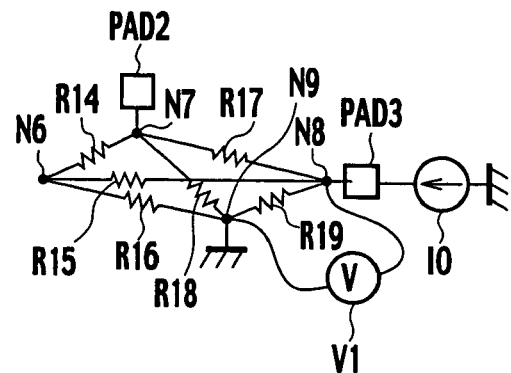
FIGS. 17A to 17D are a circuit diagram of resistor nets made up of the reduced resistor nets, which include reduced resistances of the first embodiment and reduced resistances along the shortest detected electrostatic discharge path.
Figure 17B:
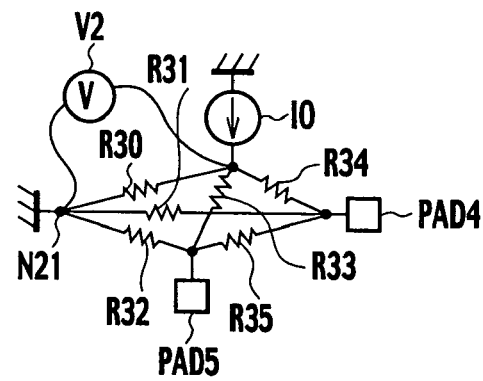
Figure 17C:
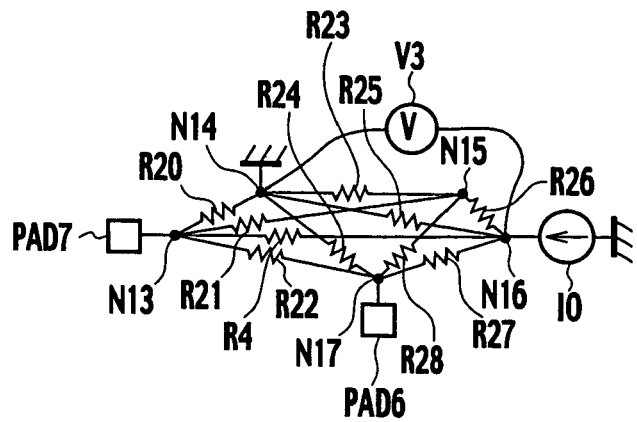
Figure 17D:
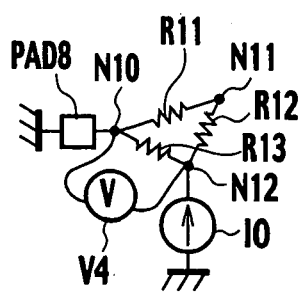

As shown in FIG. 17A, in step S11, the internodal voltage calculation unit 15 calculates the internodal voltage V1 when an electrostatic discharge current I0 flows between the connection nodes N8 and N9 for the net VDD2 arranged along the shortest path 37, considering the reduced resistances R14 to R19 connected to all connection nodes N6 to N9 formed along the net VDD2. Similarly, as shown in FIG. 17B, internodal voltage V2 when an electrostatic discharge current I0 flows between the connection nodes N18 and N21 of the net VSS2 deployed along the shortest path 37 is calculated. As shown in FIG. 17C, internodal voltage V3 when an electrostatic discharge current I0 flows between the connection nodes N16 and N14 of the net VSS1 deployed along the shortest path 37 is calculated. As shown in FIG. 17D, internodal voltage V4 when an electrostatic discharge current I0 flows between the connection nodes N12 and N10 of the net I/O deployed along the shortest path 37 is calculated.

Figure 18A:
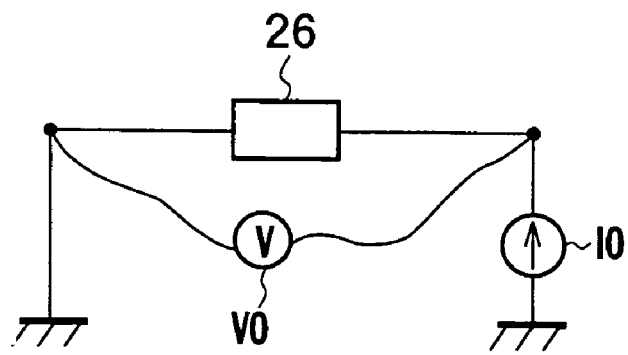
FIG. 18A is a circuit diagram for measuring voltage vs. current characteristics of a protective element of the first embodiment.
Figure 18B:
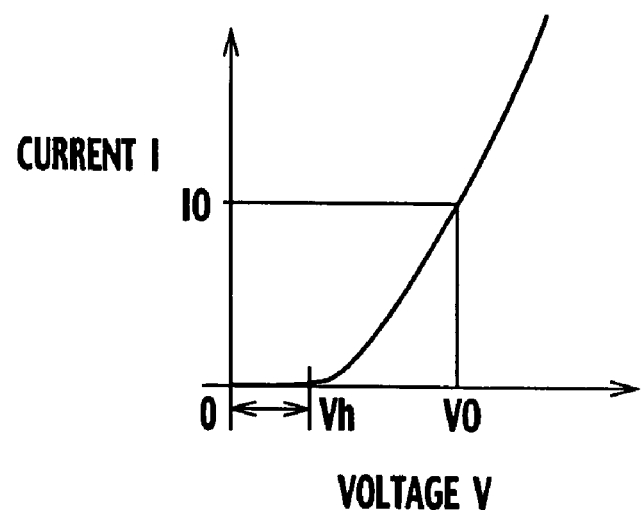
FIG. 18B is a graph of the voltage vs. current characteristics of the protective element of the first embodiment.

In addition, as shown in FIG. 18, the protective element voltage V0 applied to the extracted protective element 26 when an electrostatic discharge current I0 flows through that protective element 26 is calculated. Similarly, the protective element voltages V0 applied to each of the extracted protective elements 25 and 22 when an electrostatic discharge current I0 flows through these protective elements 25 and 22 are calculated.

In step S12, the inter-pad voltage calculation unit 16 calculates the inter-pad voltage D3 by summing internodal voltages V1 to V4 and protective element voltage V0. This allows more accurate calculation of the inter-pad voltage D3 than inter-pad voltage D3 calculated in step S10. Note that when calculating the gate-to-source/drain voltage in step S15, the node potential of each node along each net should be calculated for each net in step S11 in advance, and the node potential of each node should then be calculated by summing the node potentials and the protective element voltages appropriately in step S12.

As shown in FIG. 19, in step S13, the display unit 4 displays a window 39 on the screen of the display unit 4. The window 39 includes a field 41 for the identifiers of the starting point pad PAD1 and the like, a field 42 for the identifiers of nets VDDC and the like connected to the starting point pad PAD1 and the like, a field 43 for the identifiers of the endpoint pad PAD2 and the like, a field 44 for the identifiers of nets VDDC and the like connected to the endpoint pad PAD2 and the like, and a field 45 for the calculated inter-pad voltage values of 2.71899 V and the like. In addition, the window 39 includes associated records 46 allowing retrieval of, for example, a calculated inter-pad voltage value of 34.9216 V from the identifiers of the starting point pad PAD1 and an endpoint pad PAD128.

Figure 20:
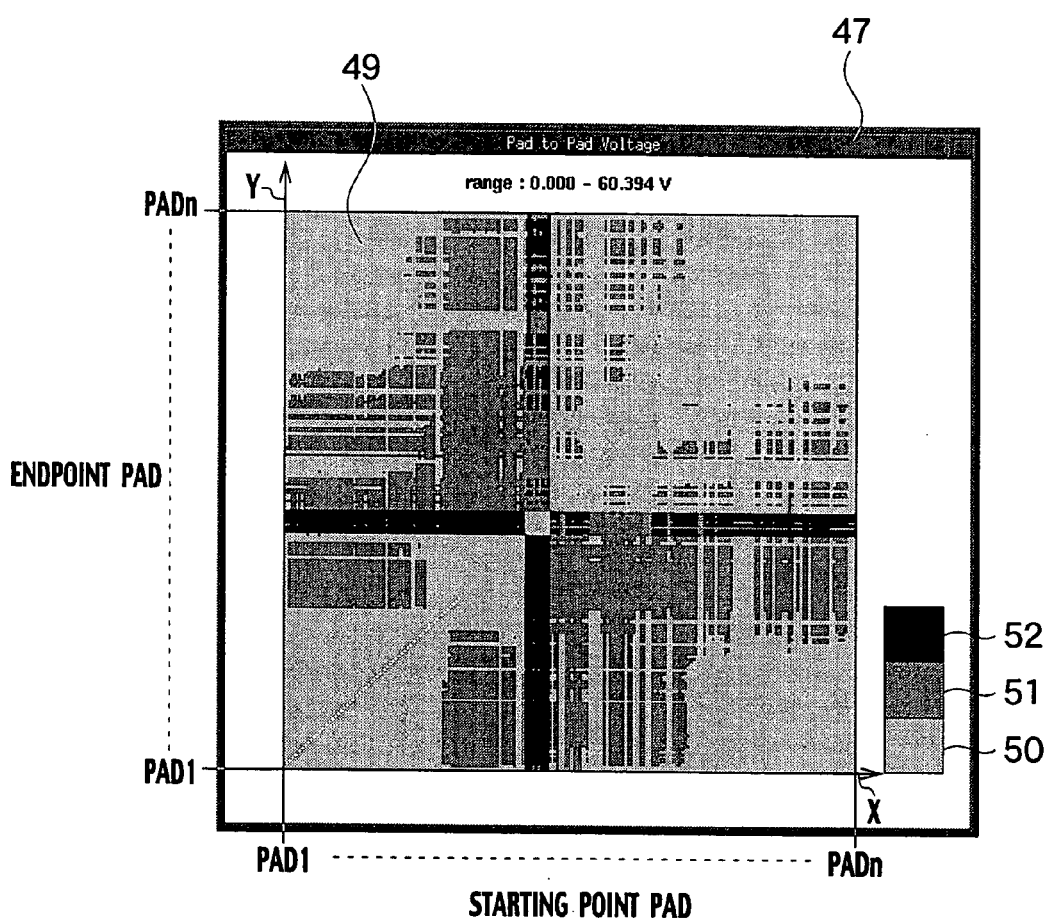
FIG. 20 is a table of two-dimensional information of the inter-pad voltages displayed on the display unit in which the inter-pad voltages of the first embodiment are categorized according to magnitude.

Furthermore, as shown in FIG. 20, in step S13, a window 47 is displayed on the screen of the display unit 4. The window 47 includes two-dimensional information 49 of inter-pad voltages, and identifiers 50 to 52 allowing identification of the ranges categorized according to inter-pad voltage values. In FIG. 20, the identifiers 50 to 52 are identified by a gray level according to printing limitations. The present invention is not so limited; alternatively, the identifiers 50 to 52 may be identified by a difference in color. Alternatively, the identifiers 50 to 52 may be identified by a difference in pattern. In the two-dimensional information 49, the inter-pad voltage between each starting point pad and each endpoint pad of a semiconductor LSI circuit is categorized with the identifiers 50 to 52. The two-dimensional information 49 has XY coordinates. The identifiers of pads PAD1 to PADn or starting point pads are provided on the X axis of the XY coordinates. The identifiers of the pads PAD1 to PADn or endpoint pads are provided on the Y axis of the XY coordinates in the same order as the X axis. The identifier, which indicates a range including the inter-pad voltage between an identifier of a starting point pad and an identifier of an endpoint pad when applying electrostatic discharge from that starting point pad assigned to an x value on the X axis to that endpoint pad assigned to a y value on the Y axis, is displayed at the position of the x value on the X axis and the y value on the Y axis of the XY coordinates.

For example, as shown in 'range: 0.000–60.394 V' in FIG. 20, all inter-pad voltages fall within the range between 0.000 V and 60.394 V. The range between 0.000 V and 60.394 V is evenly divided by three, which is equal to the number of the identifiers 50 to 52. In other words, the identifier 50 indicates that the inter-pad voltage falls within the range between 0.000 V and 20.131 V. The identifier 51 indicates that the inter-pad voltage falls within the range between 20.131 V and 40.262 V. The identifier 52 indicates that the inter-pad voltage falls within the range between 40.262 V and 60.394 V. As a result, it is apparent that when a pad is selected as a starting point pad or an endpoint pad, the inter-pad voltage is a high voltage indicated by the identifier 52. In this way, a tendency of the distribution of all inter-pad voltages can be easily understood from the two-dimensional information 49. Note that the number of the identifiers 50 to 52 is not limited to three, and can be any number. In addition, in the case of the identifiers 50 to 52, the higher the inter-pad voltage, the darker the gray level. The identifiers 50 to 52 may be identified by color, pattern, and symbol as well as gray level. Alternatively, the range of inter-pad voltages indicated by a single identifier can be set so that that range excludes a standard working range of the semiconductor device. As a result, pads between which a sub-standard inter-pad voltage occurs can be easily determined.

In step S15, the gate-to-source/drain voltage calculation unit 18 retrieves gate node identifier node names nC, nA, nF, and nG and source/drain node identifier node names nB, nD, nE, and nH using the transistor identifier transistor names M1 to M4 based on the first gate-to-source/drain voltage calculation node information D5. The gate-to-source/drain voltages of the respective transistors M1 to M4 are calculated from the differences between the node potentials of gate node identifier nodes and corresponding node potentials of source/drain node identifier nodes. The node potentials can be as calculated in step S12.

It is possible not to use a gate node identifier node and a source/drain node identifier of a node listed in the first gate-to-source/drain voltage calculation node information D5 as connection nodes, as in step S8. Then, the gate-to-source/drain voltage calculation node information generation unit 17 generates second gate-to-source/drain voltage calculation/ node information D5. This allows retrieval of connection node potential functions fA to fH capable of calculating the node potential, using gate node identifiers or source/drain node identifiers of node names nA to nH in step S8 as shown in FIG. 21. The second gate-to-source/drain voltage calculation node information D5 includes a field 68 for node identifiers and a field 69 for connection node potential functions, which allows calculation of node potentials. The second gate-to-source/drain voltage calculation node information D5 includes associated records 70 allowing retrieval of connection node potential functions, which allow calculation of node potentials from node identifiers.

In step S15, the gate-to-source/drain voltage calculation unit 18 retrieves the functions fA to fH using gate node identifiers or source/drain node identifiers of node names nA to nH based on the second gate-to-source/drain voltage calculation node information D5. The node potential of each node nA to nH is calculated by substituting the searched functions fA to fH with the connection node potentials VN1 to VNn. The gate-to-source/drain voltages of the respective-transistors M1 to M4 are calculated based on the calculated node potentials and the first gate-to-source/drain voltage calculation node information D5 in FIG. 14.

Figure 22:
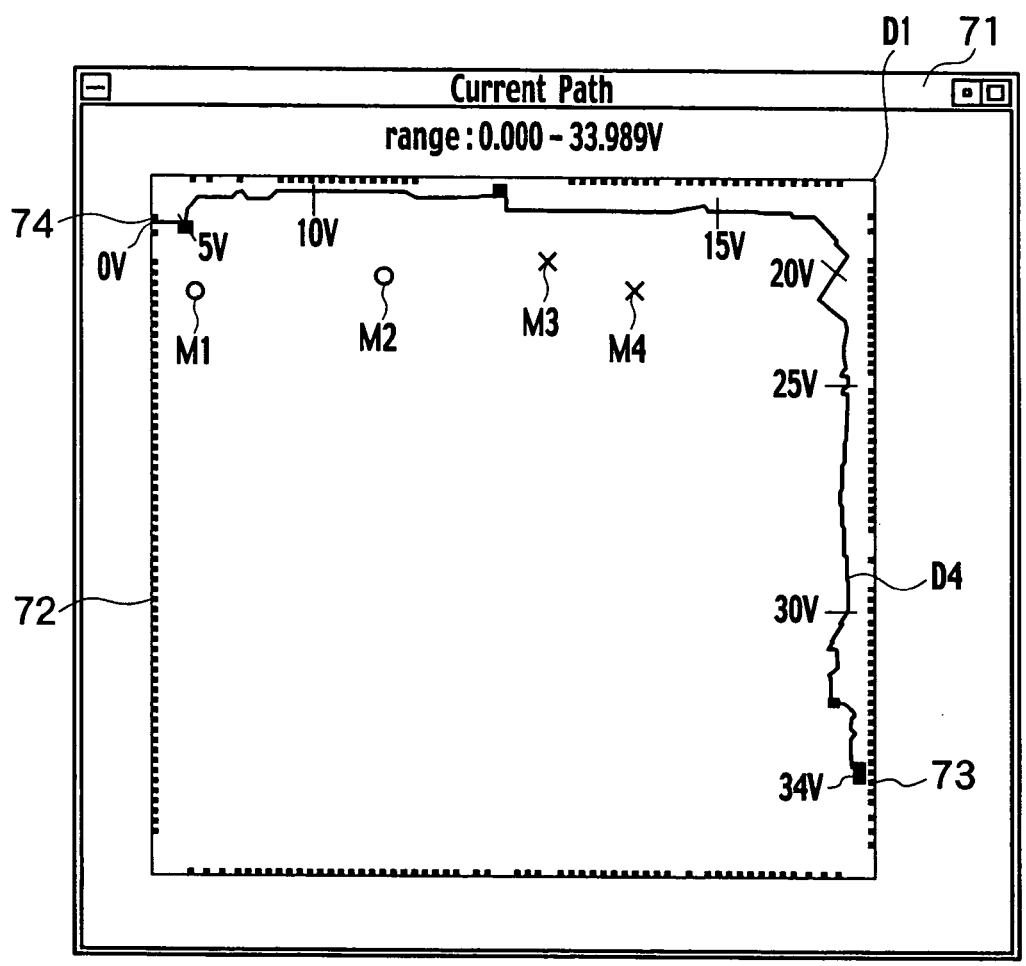
FIG. 22 is a layout showing the shortest path current path displayed on the display unit.

As shown in FIG. 22, in step S14, the display unit 4 displays a window 71 on the screen of the display unit 4. The window 71 includes a layout D1 of a semiconductor LSI circuit. The layout D1 has multiple pads 72. Using one pad of the multiple pads 72 as a starting point pad 73 and another pad as an endpoint pad 74, a current path D4 between that starting point pad 73 and that endpoint pad 74 is shown. A route of the current path D4 is determined based on the shortest path 37. More specifically, a route of the current path D4 in the layout D1 is designated so as to pass through the reduced resistances R19, R30, R25, and R13, and the protective elements 26, 25, and 22. As a result, it is apparent that the potential of the starting point pad 73 is 34 V and that the potential of the endpoint pad 74 is 0 V. Accordingly, it is apparent that the inter-pad voltage is 34 V, which is a difference between a starting point pad 73 potential of 34 V and an endpoint pad 74 potential of 0 V. In addition, the potential along the current path D4 may be displayed based on the potential of each node along the shortest path 37.

As shown in FIG. 22, in step S16, the display unit 4 displays a window 71 on the screen of the display unit 4. The window 71 includes a layout D1 of a semiconductor LSI circuit. Symbols ○ and × are displayed at the positions of the transistors M1 to M4 in the layout D1. For example, the symbol ○ is attached to the transistors M1 and M2. This indicates that the gate-to-source/drain voltages of the respective transistors M1 and M2 are lower than the withstand voltage thereof. This means that the transistors M1 and M2 will not fail, even when electrostatic discharge current flows from the starting point pad 73 to the endpoint pad 74. On the other hand, the symbol × is attached to the transistors M3 and M4. This indicates that the gate-to-source/drain voltages of the respective transistors M3 and M4 are higher than the withstand voltages thereof. This means that the transistors M3 and M4 will fail when electrostatic discharge current flows from the starting point pad 73 to the endpoint pad 74.

As described above, according to the electrostatic discharge analysis method of the first embodiment, inter-pad voltages when applying electrostatic discharge between pads can be calculated accurately.

SECOND EMBODIMENT

According to a second embodiment, the electrostatic discharge analysis apparatus 1 of the embodiment in FIG. 1 is used.

Figure 23:
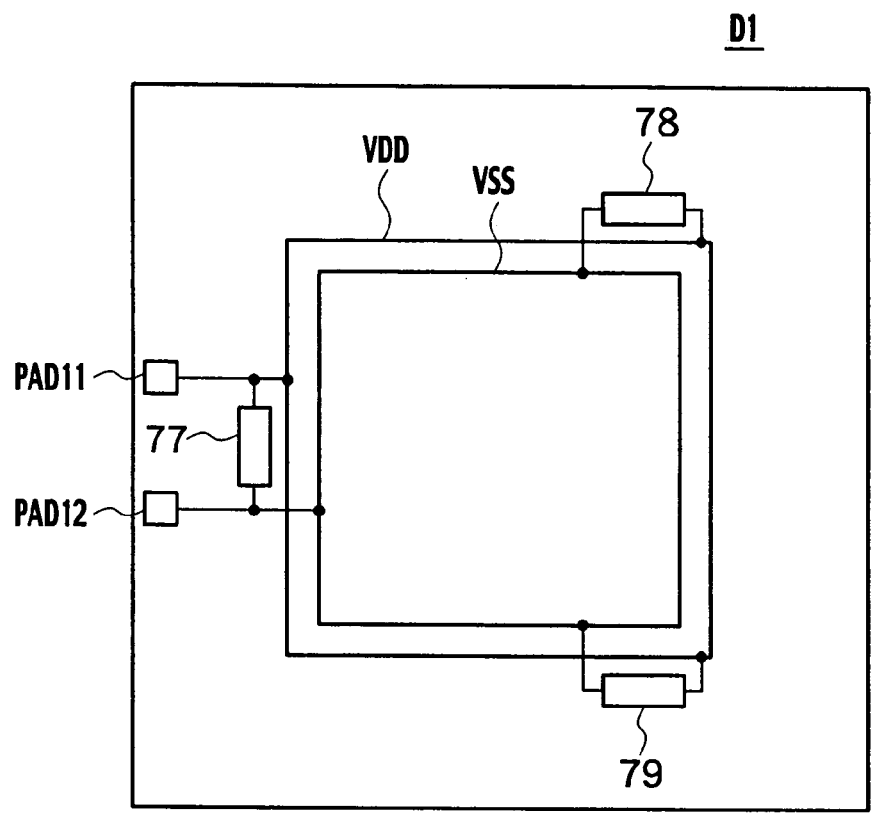
FIG. 23 is a layout of a semiconductor LSI circuit of a second embodiment.

According to the semiconductor LSI circuit electrostatic discharge analysis method of the second embodiment of the present invention, the second modified example of the electrostatic discharge analysis method of the embodiment shown in FIG. 4 is implemented with part thereof omitted. To begin with, step Si is carried out as with the first embodiment. As shown in FIG. 23, the layout D1 includes pads PAD11 and PAD12, nets VDD and VSS, and protective elements 77 to 79. The pads PAD11 and PAD12 are electrically connected to the nets VDD and VSS, respectively. The nets VDD and VSS are electrically connected to the protective elements 77 to 79, respectively.

Figure 24:
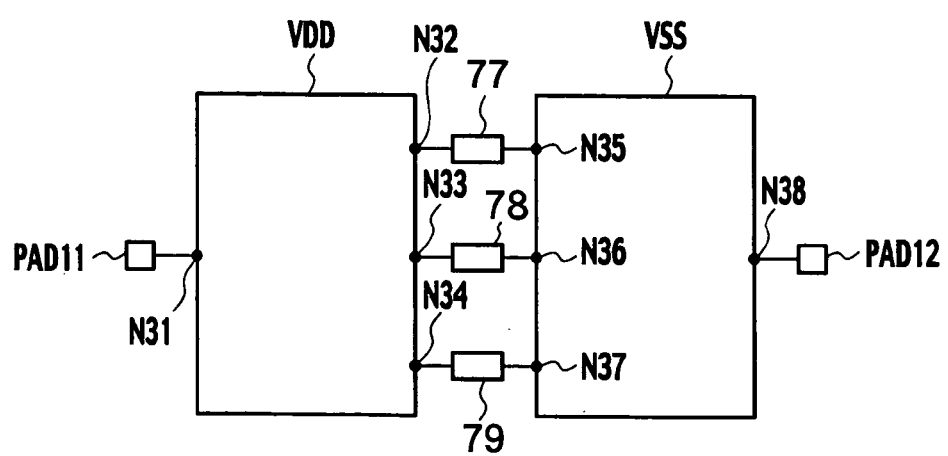
FIG. 24 is a circuit diagram of an ESD protection network made up of pads, nets, and protective elements of the second embodiment.

Step S2 is carried out as with the first embodiment. As shown in FIG. 24, all pads PAD11 and PAD12 are extracted from the layout D1. All nets VDD and VSS, which are electrically connected to the extracted pads PAD11 and PAD12, are extracted. All protective elements 77 to 79, which are electrically connected to the extracted nets VDD and VSS, are extracted. The pads PAD11 and PAD12 and/or the protective elements 77 to 79 form connection nodes N31 to N38 connected to the nets VDD and VSS. This process proceeds to step S7, skipping steps S3 through S6.

Figure 25:
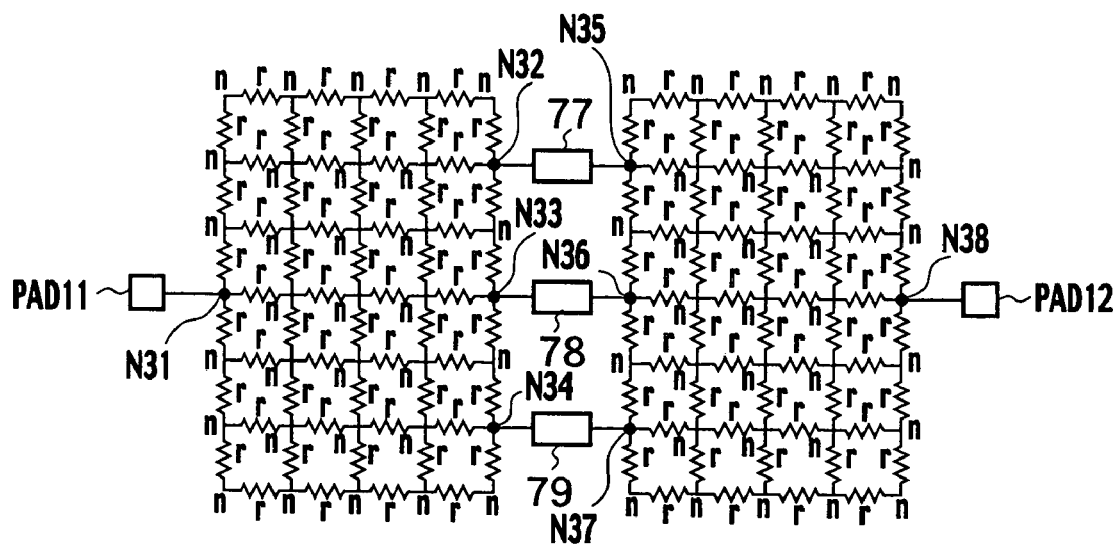
FIG. 25 is a circuit diagram of a parasitic resistor net where the nets of the second embodiment are replaced with the resistor nets made up of distributed resistances.

Steps S7 and S8 are carried out as with the first embodiment. As shown in FIG. 25, all distributed resistances r, which are distributed along the nets VDD and VSS, are extracted for each of nets VDD and VSS. The distributed resistances r are connected to the connection nodes N31 to N38 instead of the nets VDD and VSS. Inter-resistance nodes n are formed between the distributed resistances r.

Figure 26:
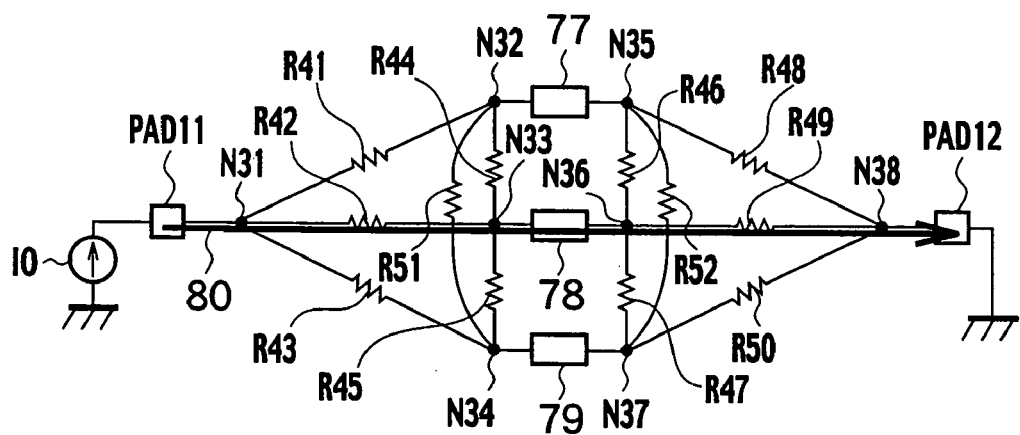
FIG. 26 is a circuit diagram of a reduced resistor net where resistor nets made up of the distributed resistances of the second embodiment are replaced with the resistor nets made up of reduced resistances.

Step S9 is carried out as with the first embodiment. As shown in FIG. 26, one of the reduced resistances R41 to R52 for each inter-connection node is connected instead of the distributed resistances r so that the combined resistance value between each connection node N31 to N38 does not change when the nets VDD and VSS are opened circuit from the protective elements 77 to 79 for each of nets VDD and VSS.

Step S10 is carried out as with the first embodiment. As shown in FIG. 26, the shortest path 80, which allows minimization of the inter-pad voltage D3, is determined, and the inter-pad voltage D3, when electrostatic discharge current I0 flows, is calculated. In addition, the reduced resistances R42 and R49 and the protective element 78 along the shortest path 80 are extracted. This process proceeds to step S13, carrying out steps S13 to S16 as with the first embodiment. More specifically, two-dimensional information of the inter-pad voltage D3 is displayed, gate-to-source/drain voltages are calculated, and the results are displayed with symbol ○ or the like.

The second embodiment allows easier calculation of the inter-pad voltages than with the first embodiment.

THIRD EMBODIMENT

In a third embodiment, the electrostatic discharge analysis apparatus 1 of the embodiment in FIG. 1 is used.

The semiconductor LSI circuit electrostatic discharge analysis method according to the third embodiment of the present invention implements the first modified example of the electrostatic discharge analysis method of the embodiments shown in FIG. 3 with part thereof omitted. In addition, the electrostatic discharge analysis method of the second embodiment and additional steps are carried out. In other words, steps S1, S2, and S7 through S10 are carried out as with the second embodiment, and this process then proceeds to step S17.

Figure 27:
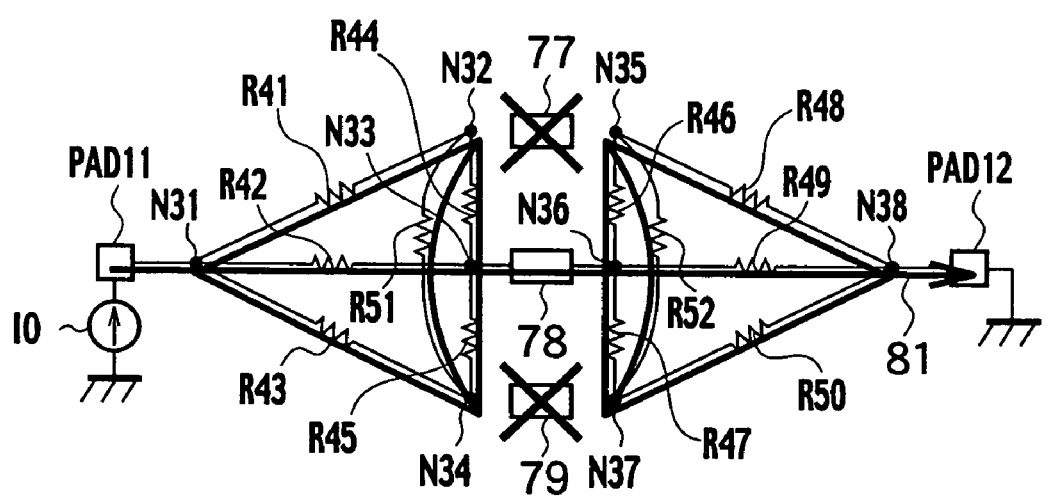
FIG. 27 is a circuit diagram of a reduced resistor net of a third embodiment showing the shortest detected electrostatic discharge path and to-be-removed protective elements.

In step S17, the protective element removing unit 14 removes the protective elements 77 and 79 that are not along the shortest path 80 in FIG. 26, and opens circuit between the connection nodes N32 and N35, and between N34 and N37 connected to the removed protective elements 77 and 79 as shown in FIG. 27.

In step S18, the node potential calculation unit 12 calculates the node potential of each connection node N31 to N38 when an electrostatic discharge current I0 flows between pads. Note that step S9 may be omitted. In this case, there are no reduced resistances R41 to R52, but only distributed resistances r. Therefore, the node potential of each of inter-resistance nodes n and that of each of connection nodes N31 to N38 are calculated.

Steps S13 to S16 are carried out as with the first embodiment. While only the shortest path 80 is considered as the electrostatic discharge path in the second embodiment, not only the shortest path 80 but also the path 81 are considered as multiple electrostatic discharge paths in the third embodiment. This allows more accurate calculation of the inter-pad voltage D3 than inter-pad voltage D3 calculated in step S10.

As described above, according to the electrostatic discharge analysis method of the third embodiment, inter-pad voltages when applying electrostatic discharge between pads may be calculated accurately.

FOURTH EMBODIMENT

In a fourth embodiment, the electrostatic discharge analysis apparatus 1 of the embodiment in FIG. 1 is used.

The semiconductor LSI circuit electrostatic discharge analysis method, according to the fourth embodiment of the present invention, implements the first modified example of the electrostatic discharge analysis method of the embodiments shown in FIG. 3 with part thereof omitted. In addition, it is partially the same as the electrostatic discharge analysis method of the third modified example. In other words, this process is carried out up to step S8 as with the third embodiment. Step S9 is not carried out.

Figure 28:
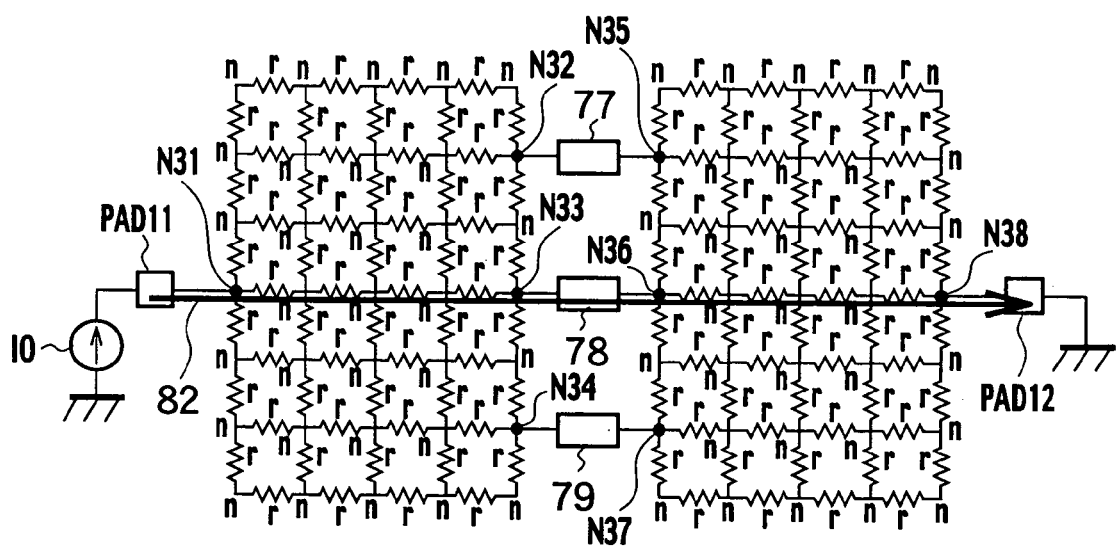
FIG. 28 is a circuit diagram of a parasitic resistor net of a fourth embodiment showing the shortest detected electrostatic discharge path.

Step S10 is carried out as with the first embodiment. As shown in FIG. 28, the shortest path 82, which allows minimization of the inter-pad voltage D3, is determined, and the inter-pad voltage D3 when electrostatic discharge current I0 flows is calculated. In addition, the distributed resistances r and the protective element 78 along the shortest path 82 are extracted.

Figure 29:
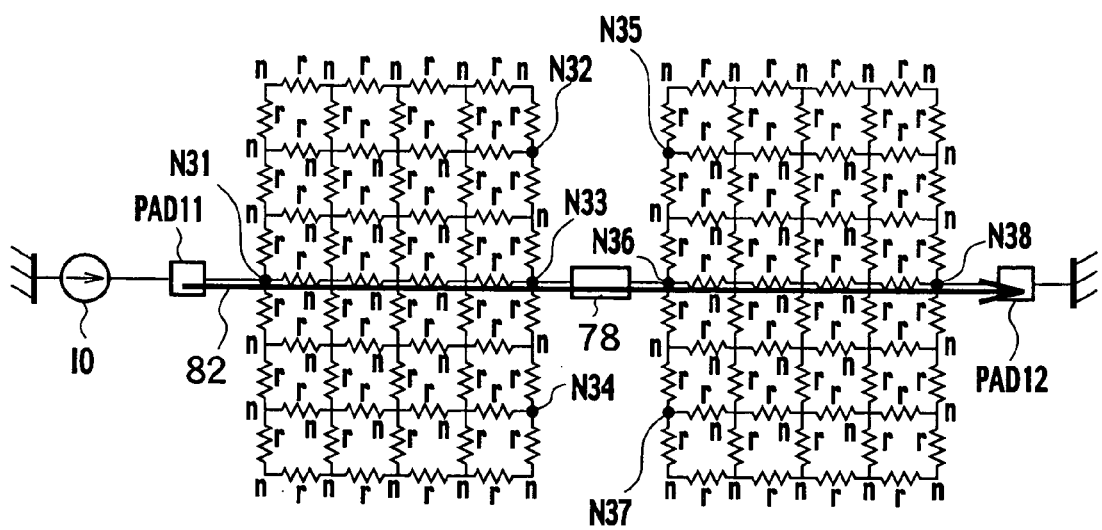
FIG. 29 is a circuit diagram of a parasitic resistor net of the fourth embodiment showing the shortest detected electrostatic discharge path but omitting to-be-removed protective elements.

Step S17 is carried out as with the third embodiment. The protective elements 77 and 79 are not along the shortest path 80 in FIG. 28 are removed, and as shown in FIG. 29, between the connection nodes N32 and N35, and between N34 and N37 connected to the removed protective elements 77 and 79 are opened up.

Figure 30:
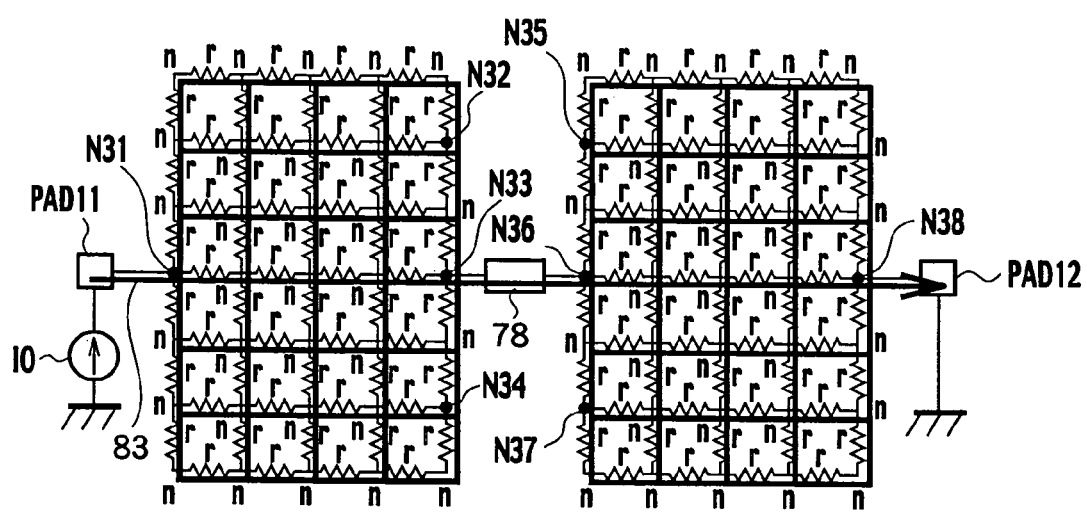
FIG. 30 is a circuit diagram of an ESD protection network in which non-existing protective elements on the shortest path of the fourth embodiment are removed.

Step S18 is carried out as with the third embodiment. As shown in FIG. 30, the node potential of each of the connection nodes N31 to N38 and that of each of the inter-resistance nodes n when an electrostatic discharge current I0 flows between pads are calculated.

Steps S13 to S16 are carried out as with the first embodiment. While only the shortest path 80 is considered as the electrostatic discharge path in the second embodiment, not only the shortest path 80 but also the path 83 is considered as multiple electrostatic discharge paths in the fourth embodiment. This allows more accurate calculation of the inter-pad voltage D3.

As described above, according to the electrostatic discharge analysis method of the fourth embodiment, inter-pad voltages when applying electrostatic discharge between pads may be calculated accurately.

FIFTH EMBODIMENT

In a fifth embodiment, the electrostatic discharge analysis apparatus 1 of the embodiment in FIG. 1 is used.

The semiconductor LSI circuit electrostatic discharge analysis method according to the fifth embodiment of the present invention implements the first modified example of the electrostatic discharge analysis method of the embodiment shown in FIG. 2 twice. To begin with, the first implementation is carried out in the same way as the first embodiment.

Figure 31:
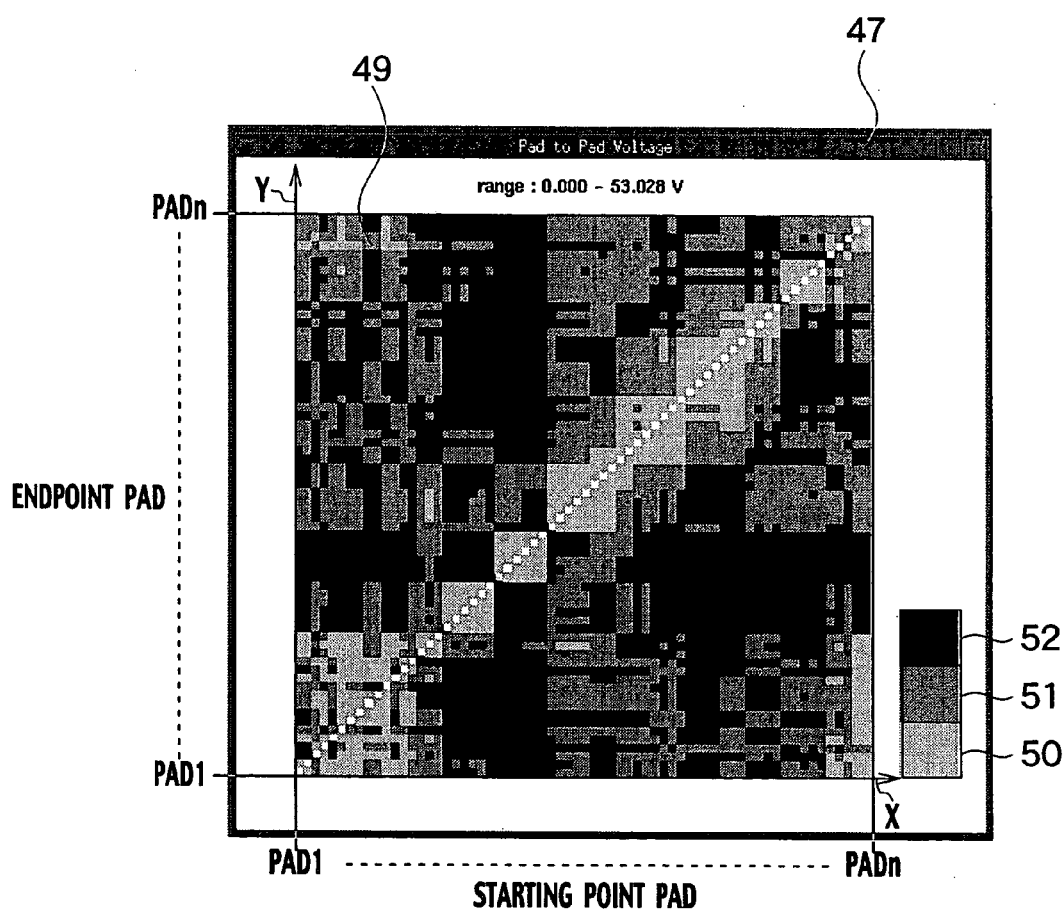
FIG. 31 is a two-dimensional information table of the inter-pad voltages displayed on the display unit prior to re-arranging the protective elements of a fifth embodiment.

As shown in FIG. 31, in step S13, a window 47 is displayed on the screen of the display unit 4. The window 47 includes two-dimensional information 49 of inter-pad voltages, and identifiers 50 to 52 categorized according to inter-pad voltage values. The two-dimensional information 49 categorizes all inter-pad voltages with the identifiers 50 to 52. For example, as shown in 'range: 0.000–53.028 V' in FIG. 31, all inter-pad voltages fall within the range between 0.000 V and 53.028 V. The range between 0.000 V and 53.028 V is evenly divided into three or a number equal to the number of the identifiers 50 to 52. In other words, the identifier 50 indicates that the inter-pad voltages fall within the range between 0.000 V and 17.676 V. The identifier 51 indicates that the inter-pad voltages fall within the range between 17.676 V and 35.352 V. The identifier 52 indicates that the inter-pad voltages fall within the range between 35.352 V and 53.028 V. In the case of the identifiers 50 to 52, the higher the inter-pad voltage, the darker the gray level, as previously discussed.

Next, positions of the protective elements 21 to 26 in the target layout D1 or positions thereof in the ESD protection network may be changed, and the number of protective elements 21 to 26 may be increased or decreased.

Figure 32:
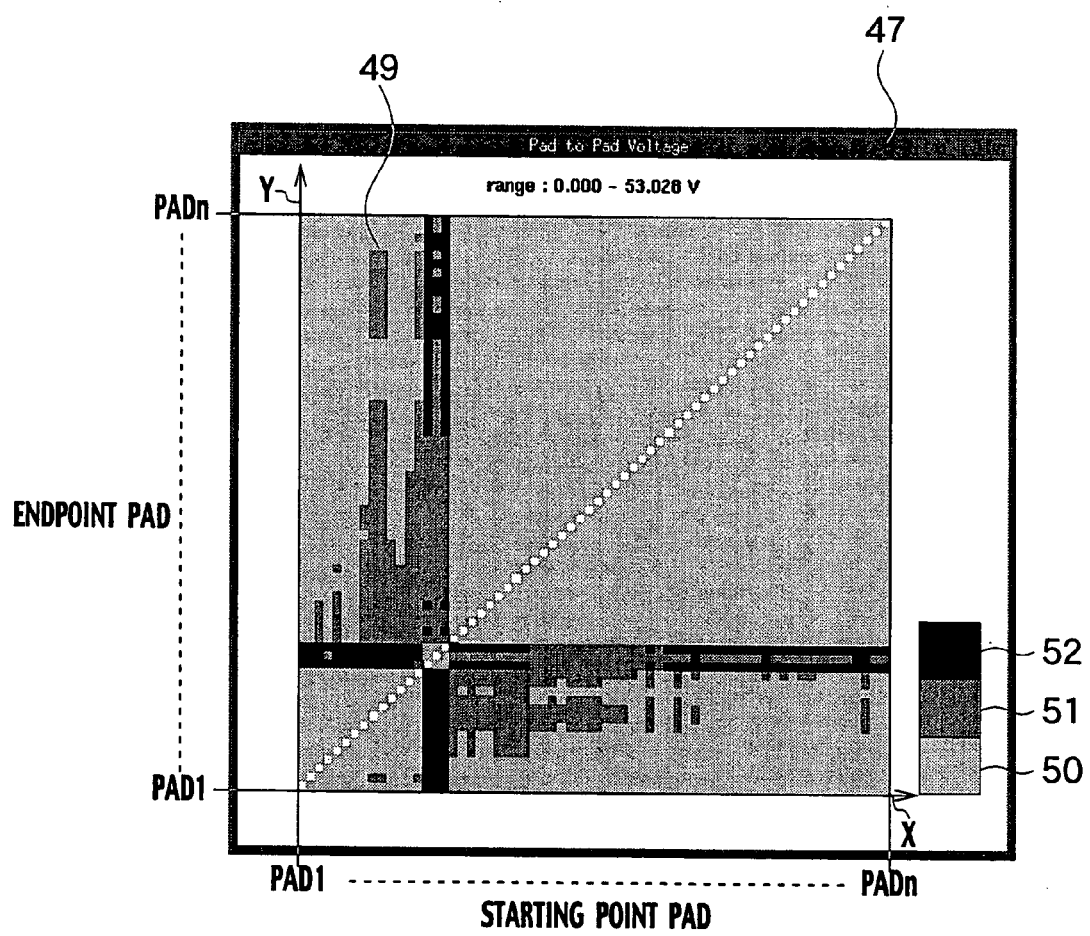
FIG. 32 is a two-dimensional information table of the inter-pad voltages displayed on the display unit after re-arranging the protective elements of the fifth embodiment.

The second implementation is then carried out in the same way as in the first embodiment. The target layout D1 is one in which the positions of the protective elements may be changed and the number of protective elements may be increased or decreased after the first implementation. As with the first implementation, a window 47 is displayed on the screen of the display unit 4 in step S13 as shown in FIG. 32. The window 47 includes two-dimensional information 49 of inter-pad voltages, and identifiers 50 to 52 categorized according to inter-pad voltage value. Here, the 'range: 0.000–53.028 V' in FIG. 32 matches the 'range: 0.000–53.028 V' in FIG. 31, and all categorized ranges of the identifiers 50 to 52 in FIGS. 31 and 32 match.

As a result, variation in all the inter-pad voltages due to change in the number of protective elements can be easily determined. In other words, comparison of the two dimensional information 49 in FIG. 32 with two-dimensional information 49 in FIG. 31 allows easy and quick recognition of a decrease in the identifier 52 displayed area, an increase in the identifier 50 displayed area, and a decrease in all the inter-pad voltages.

SIXTH EMBODIMENT

In a sixth embodiment, the electrostatic discharge analysis apparatus 1 of the embodiment in FIG. 1 is used.

The semiconductor LSI circuit electrostatic discharge analysis method, according to the sixth embodiment of the present invention, implements the first modified example of the electrostatic discharge analysis method of the embodiment shown in FIG. 2.

Figure 33:
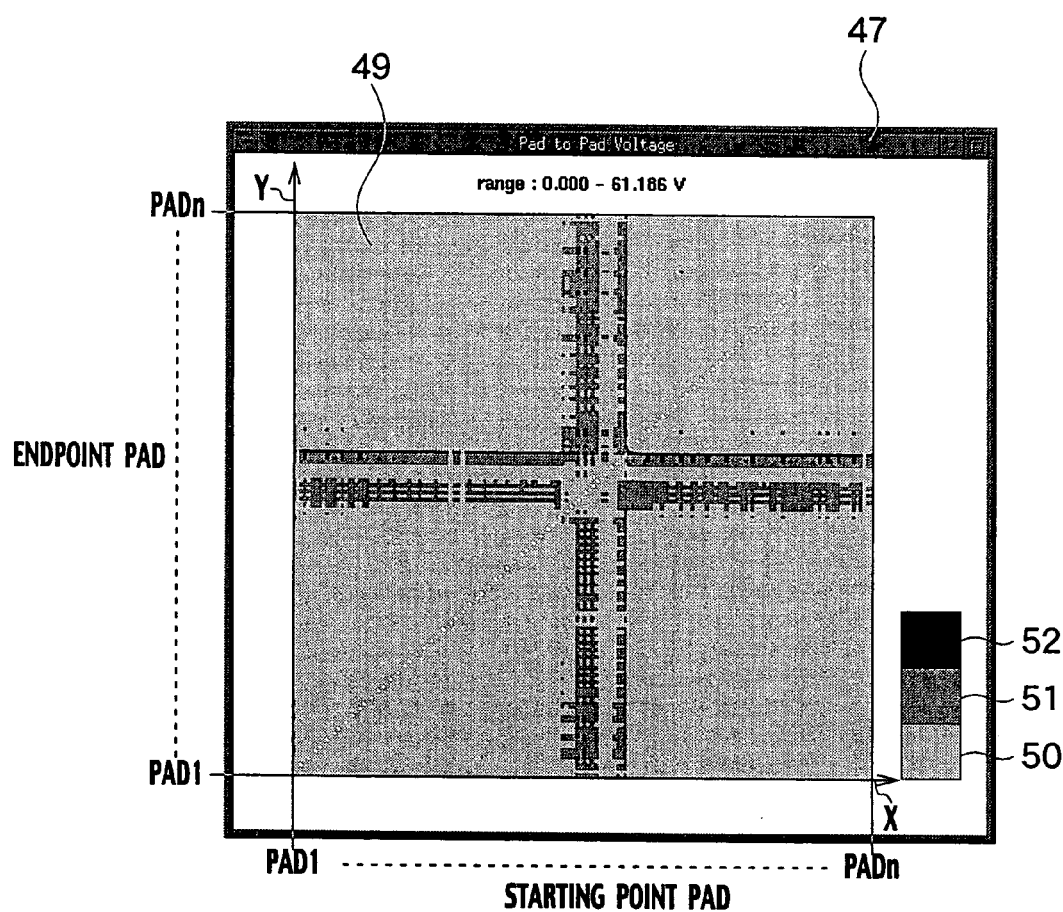
FIG. 33 is a two-dimensional information table of the inter-pad voltages displayed on the display unit after re-arranging the protective elements of a sixth embodiment.

In step S13, two-dimensional information 49 of inter-pad voltages, and identifiers 50 to 52 categorized according to inter-pad voltage value are displayed in the window 47 on the screen of the display unit 4 as shown in FIG. 33. The two-dimensional information 49 allows categorization of all inter-pad voltages with the identifiers covering respective ranges of inter-pad voltage values. For example, as shown in 'range: 0.000–61.186 V' in FIG. 33, all inter-pad voltages fall within the range between 0.000 V and 61.186 V. The range between 0.000 V and 61.186 V is evenly divided by three or a number equal to the number of the identifiers 50 to 52. In other words, the identifier 50 indicates that the inter-pad voltages fall within the range between 0.000 V and 20.395 V. The identifier 51 indicates that the inter-pad voltages fall within the range between 20.395 V and 40.790 V. The identifier 52 indicates that the inter-pad voltages fall within the range between 40.790 V and 61.186 V. With the identifiers 50 to 52, the higher the inter-pad voltage, the darker the gray level, as previously discussed.

It is apparent from observation of the distribution of the identifiers 50 to 52, which are the two-dimensional information 49, that when a pad is selected as the starting point pad or the endpoint pad, high voltages shown by the identifiers 52 and 51 appear. In this way, a tendency of the distribution of all inter-pad voltages can be easily understood from the two-dimensional information 49. In addition, a pad that causes a high inter-pad voltage can be easily recognized.

SEVENTH EMBODIMENT

Two inter-pad voltage analysis methods are described first as comparative examples of a seventh embodiment. One is a circuit simulation method, and the other is a shortest path determination method.

Figure 34:
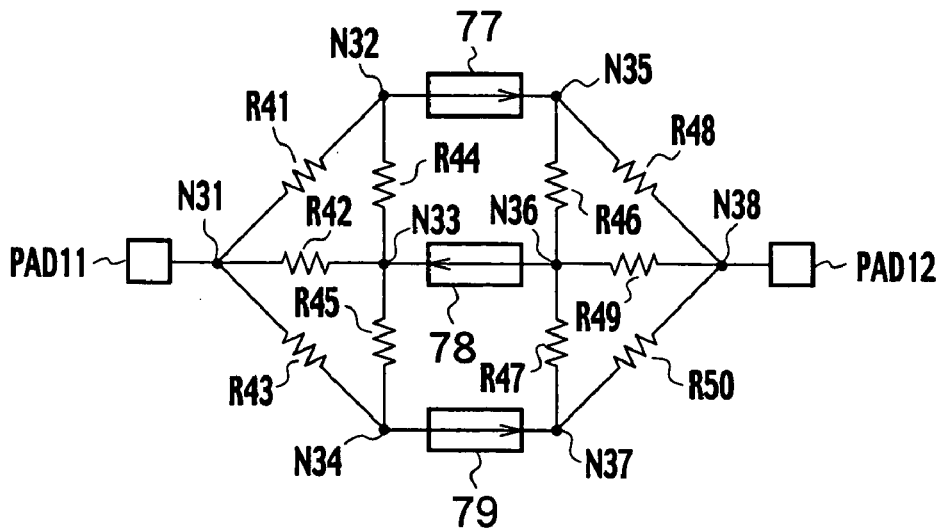
FIG. 34 is a circuit diagram of an ESD protection network for describing a circuit simulation method and a shortest path determination method.
Figure 35:
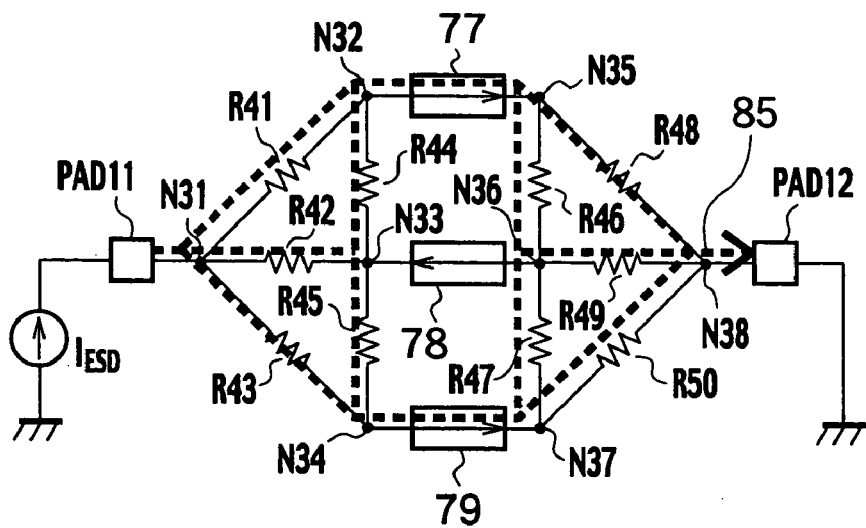
FIG. 35 is a circuit diagram of an ESD protection network showing an electrostatic discharge path for describing the circuit simulation method.

To begin with, the circuit simulation method of the comparative example of the seventh embodiment is described. A current source IESD, which provides electrostatic discharge current IESD, is connected to a pad PAD11 in the ESD protection network extracted from the layout as shown in FIG. 34, and a grounded pad PAD12 is grounded as shown in FIG. 35. A circuit simulator implements DC analysis for the ESD protection network using the circuit simulation method, and calculates the inter-pad voltage between the pad PAD11 and the grounded pad PAD12. More specifically, the potential of the pad PAD11 is equal to the inter-pad voltage. Since the circuit simulation method considers all current paths 85, inter-pad voltages can be calculated accurately. However, it takes approximately 10 minutes to analyze a single pad pair of the pad PAD11 and the grounded pad PAD12 of a semiconductor LSI circuit with a standard chip size. Therefore, in the semiconductor LSI circuit, only a very limited number of pairs of pads can be analyzed.

Figure 36:
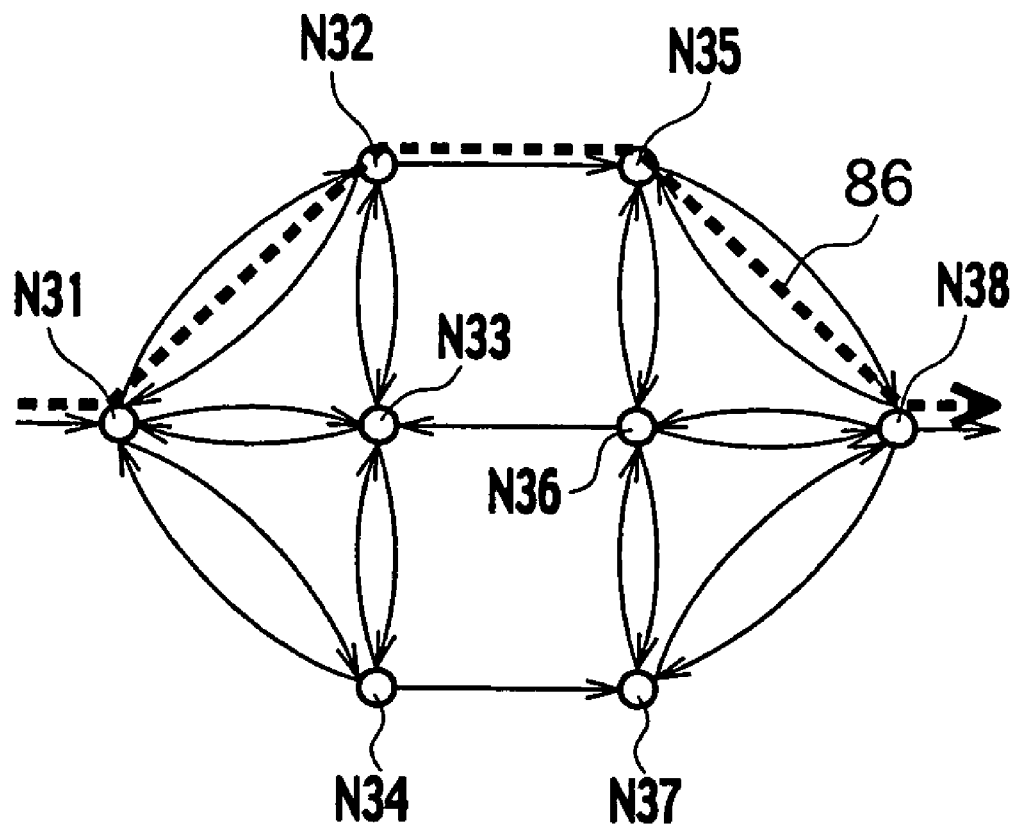
FIG. 36 is a directed graph for an ESD protection network showing an electrostatic discharge current path for describing the shortest path determination method.

Next, the shortest path determination method of the comparative example of the seventh embodiment is described. As shown in FIG. 36, a directed graph is generated by the ESD protection network extracted from the layout as shown in FIG. 34. Directional branches with specific directions equal to the respective directions of currents allowed to flow through the respective protective elements 77 to 79 are generated for the protective elements 77 to 79, respectively. Bidirectional branches are generated for the resistance elements R41 to R50. The inter-terminal voltage that occurs when an electrostatic discharge current IESD flows is given to an element corresponding to each branch is given to each the branch as a weight. In this way, a directed graph is generated. The shortest path determination method using Dijkstra's algorithm is carried out for that directed graph. The current path 86, which allows minimization of the inter-pad voltage of a pad pair of the pad PAD11 and the grounded pad PAD12, is determined. As a result, the current path 86, which allows minimization of inter-pad impedance, and the inter-pad voltage when electrostatic discharge current IESD flows through that current path 86 can be calculated. Since the shortest path determination method using Dijkstra's algorithm is carried out at a very high speed, all pad pairs in a semiconductor LSI circuit may be analyzed. However, there is a problem of overestimation of inter-pad voltages calculated by using the shortest path determination method rather than the precise solution thereof, since only one current path 86 is considered. In order to solve that problem, a shortest path determination method using a convex minimum cost maximum flow algorithm is proposed. The convex minimum cost maximum flow algorithm can be carried out faster than the circuit simulation method, however, it takes too long to analyze all pad pairs in a semiconductor LSI circuit.

The circuit simulation method can provide high accuracy in analysis results, but requires too much time; therefore, all pad pairs in a semiconductor LSI circuit cannot be analyzed. On the other hand, since the analysis speed according to the shortest path determination method is high, analysis of all pad pairs is possible, but the analysis accuracy is poor. Therefore, an analysis method according to the seventh embodiment allowing analysis of all pad pairs and provision of high analysis accuracy is possible.

With the method of the seventh embodiment, to begin with, the shortest inter-pad path between the starting point pad and the endpoint pad is determined using the shortest path determination method. A resistor net, which includes entry nodes, exit nodes, and resistances along the shortest path but does not include a protective element, is selected. DC analysis is carried out for the selected resistor net using the circuit simulation method, and the resistor net voltage between the entry node and the exit node in the resistor net is calculated. The inter-pad voltage between the starting point pad and the endpoint pad is calculated by summing up the analyzed resistance network voltages and the clamped voltage of the protective element on the shortest inter-pad path. In this way, since the circuit simulation method is applied to only the resistor net which does not include a protective element, high-speed analysis can be implemented without degrading the accuracy of the analysis results.

The analysis method of the seventh embodiment is described below in further detail.

Figure 37:
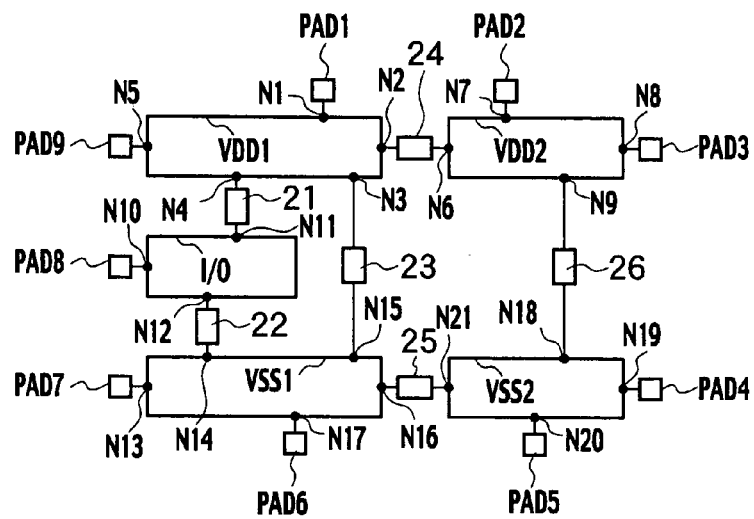
FIG. 37 is a circuit diagram of an ESD protection network including pads, nets, and protective elements of a seventh embodiment.

To begin with, as shown in FIG. 37, in step S21, the ESD protection network is extracted as in step S2 and FIG. 7 of the first embodiment.

Figure 38:
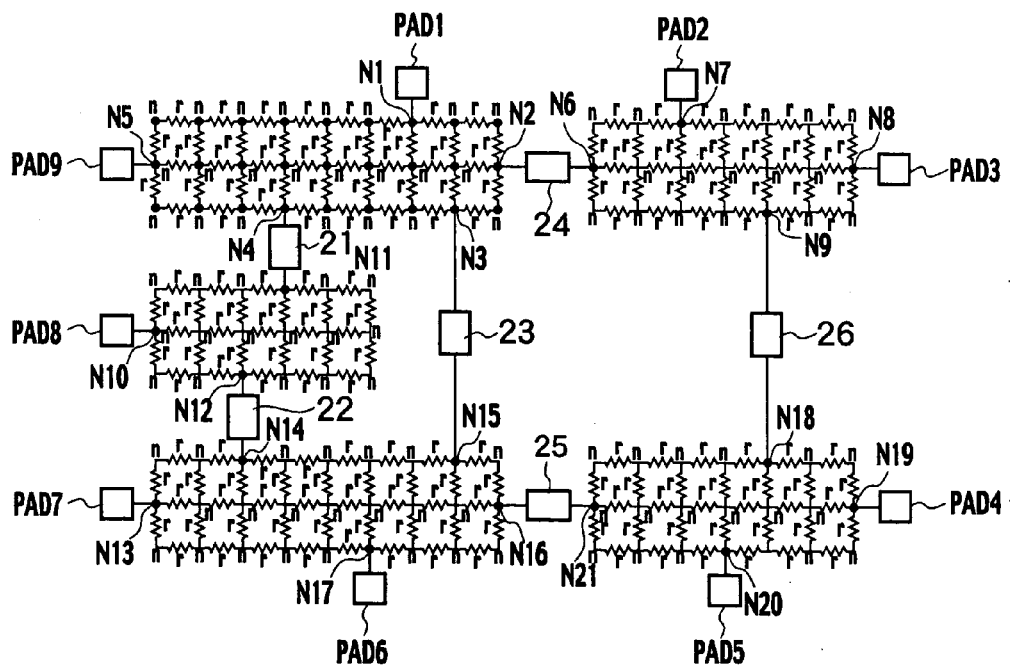
FIG. 38 is a circuit diagram of an ESD protection network where the nets of the seventh embodiment are replaced with the resistor nets made up of distributed resistances.

Next, as shown in FIG. 38, in step S22, the parasitic resistor net of each net is extracted as in step S7 and FIG. 12 of the first embodiment.

Figure 39:
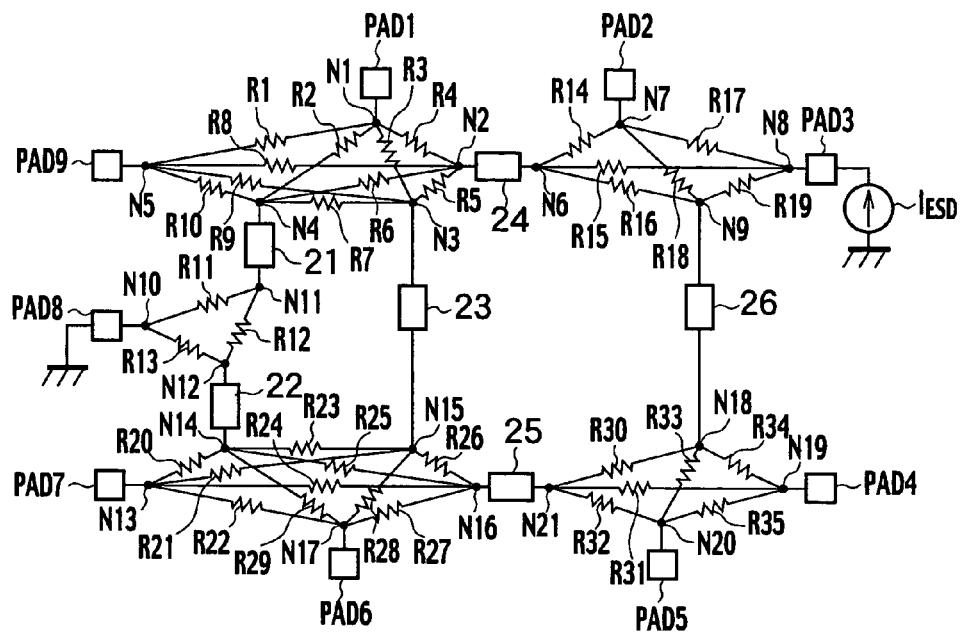
FIG. 39 is a circuit diagram of an ESD protection network where resistor nets made up of the distributed resistances of the seventh embodiment are replaced with the resistor nets made up of reduced resistances.

As shown in FIG. 39, in step S23, the parasitic resistor net is reduced as in step S9 and FIG. 15 of the first embodiment.

Figure 40:
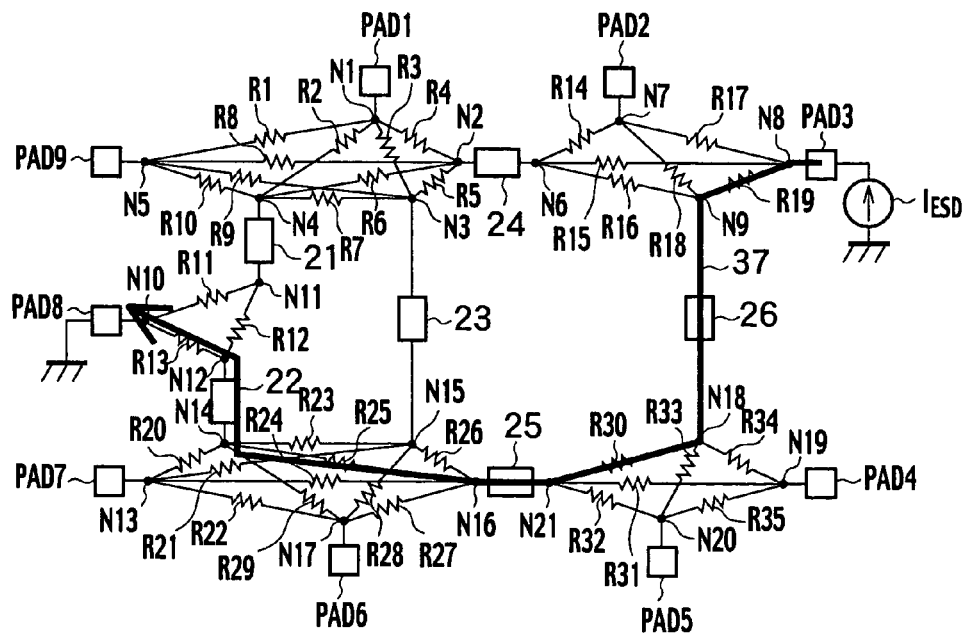
FIG. 40 is a circuit diagram of the ESD protection networks of the seventh embodiment showing the shortest detected electrostatic discharge path.

As shown in FIG. 40, in step S24, the shortest inter-pad path 37 between the starting point pad PAD3 and the endpoint pad PAD8 is determined by using the shortest path determination method as in step S10 and FIG. 16 of the first embodiment. Similarly, current path information such as the shortest path 37 is determined by using the shortest path determination method for each of all pad pairs of the starting point pads and endpoint pads arbitrarily selected from pads PAD1 to PAD9.

Figure 41:
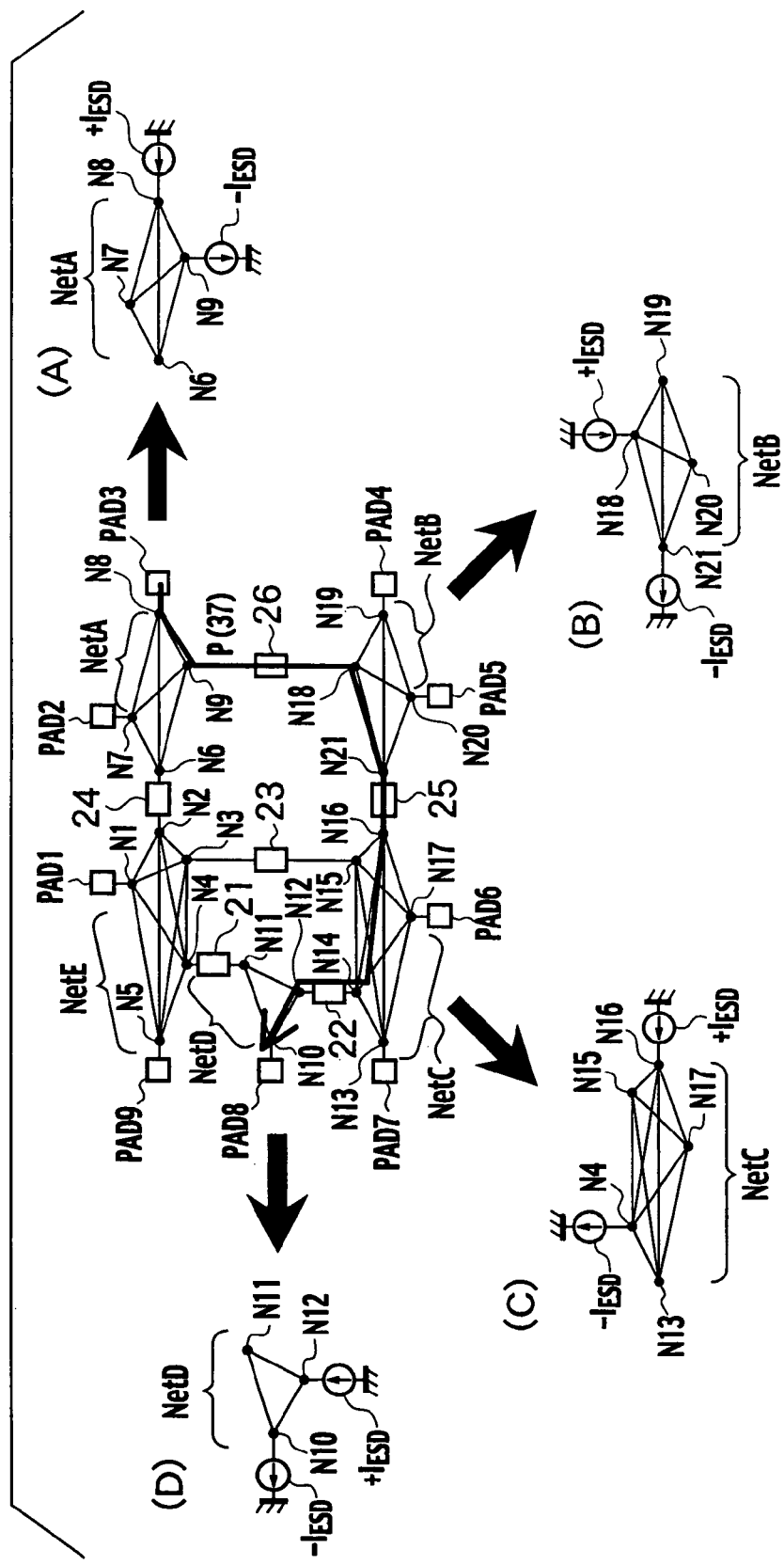
FIG. 41 is a circuit diagram of the ESD protection networks of the seventh embodiment and circuit diagrams of resistor nets including the reduced resistor net along the shortest detected electrostatic discharge path made up of only reduced resistances.

As shown in FIG. 41, in step S25, the parasitic resistor nets NetA to NetD through which the shortest path P (37) passes are extracted from the reduced parasitic resistor nets NetA to NetE as in step S11 and FIGS. 17A to 17D of the first embodiment. The parasitic resistor nets NetA to NetD include entry nodes N8, N18, N16, and N12, and exit nodes N9, N21, N14, and N10, which are connection nodes along the shortest path P (37), but do not include the protective elements 21 to 26. The current sources +IESD and −IESD are connected to the entry nodes N9, N18, N16, and N12, and the exit nodes N9, N21, N14, and N10, respectively. DC analysis is carried out for the extracted parasitic resistor nets NetA to NetD using the circuit simulation method, calculating the potential differences between the entry nodes N8, N18, N16, and N12 and corresponding exit nodes N9, N21, N14, and N10 in the parasitic resistor nets NetA to NetD. This allows calculation of internodal voltages between the entry nodes N8, N18, N16, and N12 and corresponding exit node N9, N21, N14, and N10 in the parasitic resistor nets NetA to NetD, considering all current paths. Summation of the calculated internodal voltage in each of parasitic resistor nets NetA to NetD and a clamped voltage of each of the protective elements 22, 25, 26 along the shortest path P (37) provides a highly accurate inter-pad voltage considering all current paths within the parasitic resistor nets NetA to NetD.

To analyze all pad pairs, numerous internodal voltages must be calculated for each parasitic resistance network NetA to NetE. Subsequently, analysis speed is improved using a method shown in the flowchart of FIG. 42.

The internodal voltage calculation unit 15 generates a node pair table, which allows search of node pairs of entry nodes and corresponding exit nodes along the shortest paths P, Q, and R in the parasitic resistor nets Net1 and Net2. All node pairs of which internodal voltages must be calculated are associated with the parasitic resistor nets Net1 and Net2 so as to allow retrieval of node pairs by the parasitic resistor nets Net1 and Net2, and recorded in the node pair table for each of parasitic resistor nets Net1 and Net2. For example, the entry node N41 and the exit node N45 along the shortest path P in the parasitic resistor net Net1 are associated with each other and recorded in the node pair table so as to allow search by the parasitic resistor net Net1. Note that in step S37, the internodal voltage V1 of the node pair of the entry node N41 and the exit node N45 is associated with the node pair (N41, N45) and recorded in the node pair table so as to allow search by the node pair (N41, N45). Similarly, the node pairs (N42, N45) and (N43, N44) along the shortest path P in the parasitic resistor net Net1 are associated and recorded in the node pair table so as to allow search by the parasitic resistor net Net1. Note that in step S37, the internodal voltage V2 of the node pair (N42, N45) and the internodal voltage V3 of the node pair (N43, N44) are associated and recorded in the node pair table so as to allow search by the node pairs (N42, N45), (N43, N44). The node pairs (N46, N49), (N46, N50), and (N47, N48) along the shortest paths P, Q, R in the parasitic resistor net Net2 are associated and recorded in the node pair table so as to allow search by the parasitic resistor net Net2. Note that in step S37, the internodal voltage V4 of the node pair (N46, N49), the internodal voltage V5 of the node pair (N46, N50), and the internodal voltage V6 of the node pair (N47, N48) are associated and recorded in the node pair table so as to allow search by the node pairs (N46, N49), (N46, N50) and (N47, N48).

Figure 42:
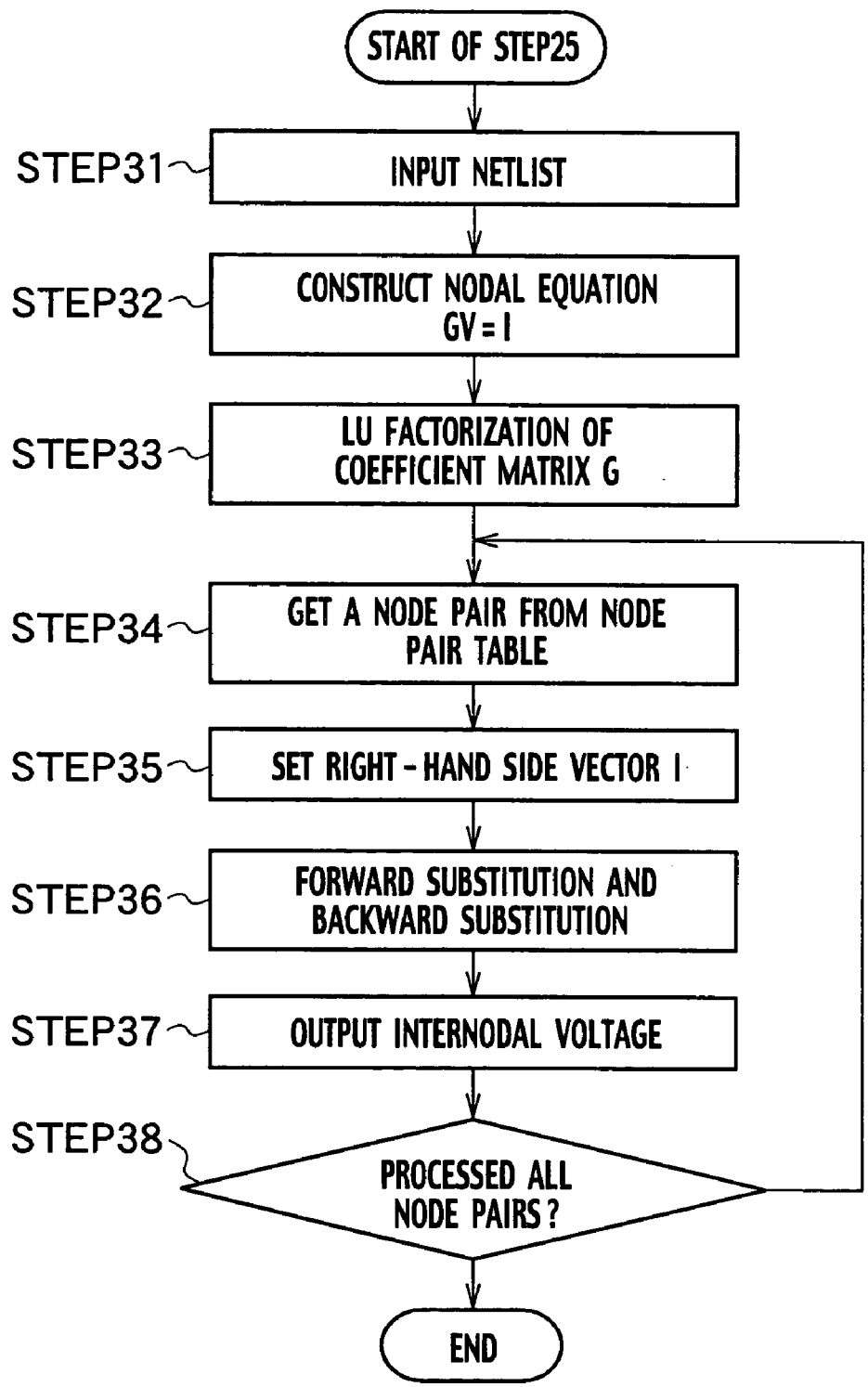
FIG. 42 is a flowchart for step S25 of an electrostatic discharge analysis method of the seventh embodiment.
Figure 43:
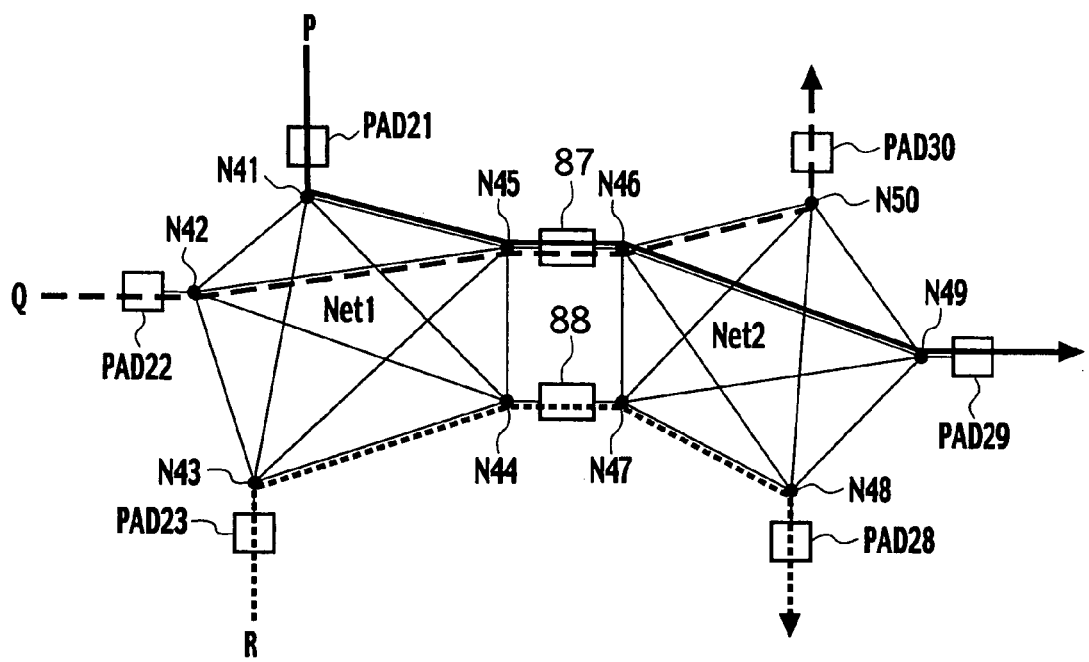
FIG. 43 is a circuit diagram of an ESD protection network of the seventh embodiment showing detected multiple shortest electrostatic discharge paths.

As shown in FIG. 42, in step S31, the internodal voltage calculation unit 15 inputs netlist for the parasitic resistance network Net1 in the ESD protection network as shown in FIG. 43.

Figures 45, 46:
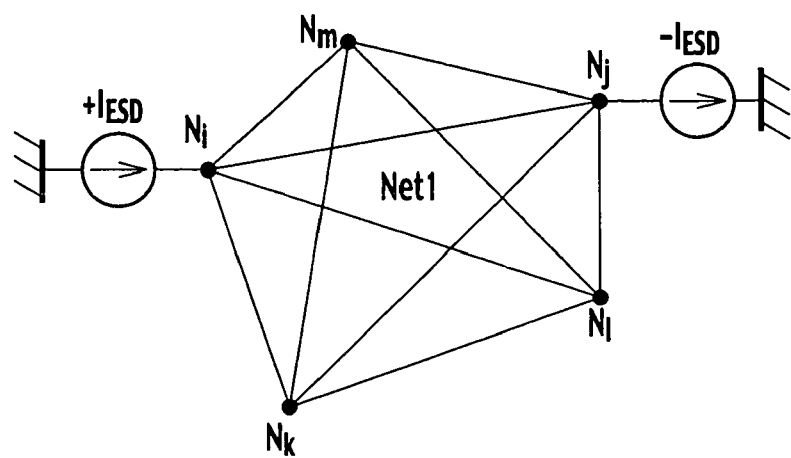
FIG. 45 is a circuit diagram of a resistor net made up of only reduced resistances including reduced resistances along the shortest path of the seventh embodiment.
FIG. 46 is a nodal equation for the resistor net made up of only reduced resistances including reduced resistances along the shortest path of the seventh embodiment.

In step S32, as shown in FIG. 46, the internodal voltage calculation unit 15 constructs a nodal equation GV=I of the parasitic resistor net Net1. The coefficient matrix G of the nodal equation is a conductance matrix of the parasitic resistor net Net1. The node potential vector V includes potential of each of nodes N1 to Nn as an element. The current source vector I is a vector including current sources +IESD and −IESD, which are connected to each of nodes N1 to Nn, as members. As shown in FIG. 46, the current source +IESD connected to the node Ni corresponds to a member +IESD at the i-th line of the current source vector I. The current source −IESD connected to the node Nj corresponds to a member −IESD at the j-th line of the current source vector I.

In step S33, the internodal voltage calculation unit 15 carries out LU factorization of the coefficient matrix G of the nodal equation GV=I.

In step S34, the internodal voltage calculation unit 15 extracts the node pair of the node Ni and the node Nj from the parasitic resistor net Net1 based on the node pair table.

In step S35, the internodal voltage calculation unit 15 sets the current source vector I of the nodal equation based on when an electrostatic discharge current IESD flows between the extracted node pair of the node Ni and the node Nj.

In step S36, the internodal voltage calculation unit 15 calculates the node potential vector V of the nodal equation by forward substitution and backward substitution of the nodal equation using the current source vector Iij and the LU factorized coefficient matrix G. The potential of each of connection nodes N1 to Nn, which are elements of the node potential vector V, is calculated. As a result, the potential of each of nodes Ni and Nj is calculated.

In step S37, the internodal voltage calculation unit 15 calculates the internodal voltage between the extracted nodes Ni and Nj based on the node potential vector V. Calculation of the difference in potential of the nodes Ni and Nj allows calculation of the internodal voltage between the nodes Ni and Nj. The internodal voltage between the nodes Ni and Nj is recorded in the node pair table.

Figure 47:
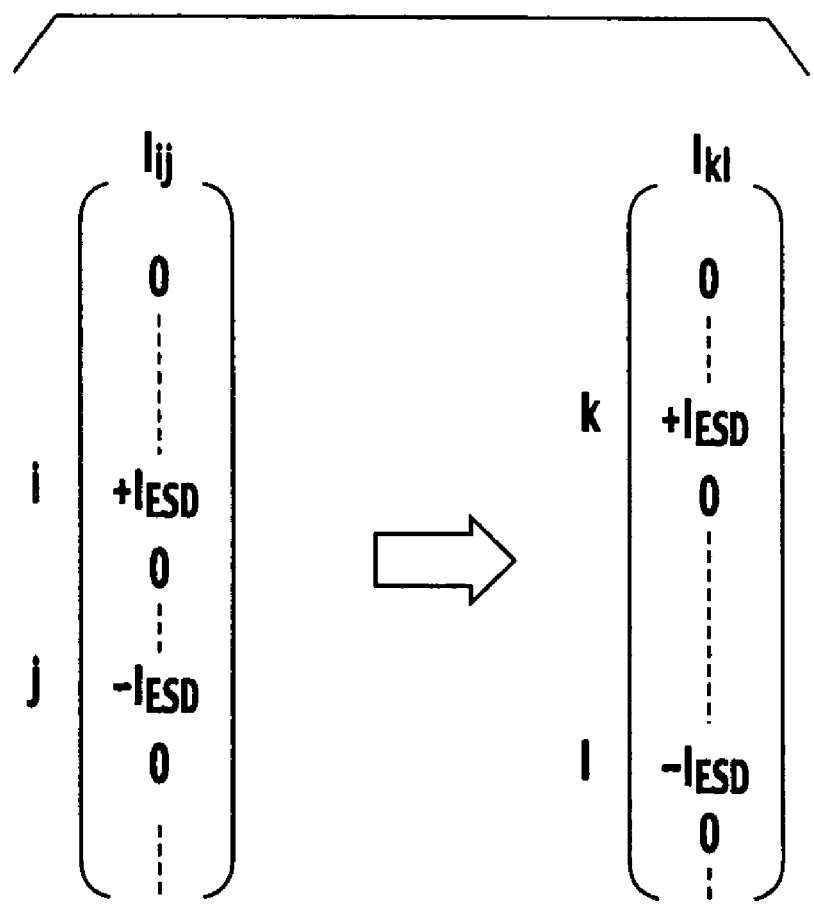
FIG. 47 is a diagram for describing a nodal equation current vector setting method.

In step S38, the internodal voltage calculation unit 15 determines whether all node pairs in the parasitic resistance network Net1 are extracted from the node pair table. If all node pairs are not extracted from the node pair table, this process returns to step S34. The same coefficient matrix G of the nodal equation is used to find the internodal voltage between the node pair of the node Ni and the node Nj of the parasitic resistance network Net1, and to find the internodal voltage between the node pair of the node Nk and the node Nl of the parasitic resistance network Net1. The results of LU factorization of the coefficient matrix G can be reused. The LU factorization of the coefficient matrix G of the parasitic resistance network Net1 should be carried out only once. Accordingly, in the case of the node pair of the node Nk and the node N1, only the current source vector Iij is changed to the current source vector Ikl as shown in FIG. 47. The node potential vector V of the nodal equation is calculated by forward substitution and backward substitution of the nodal equation reusing the current source vector Ikl and the LU factorized coefficient matrix G. The potential of each of nodes N1 to Nn, which are members of the node potential vector V, is calculated. As a result, the potential of each of nodes Nk and N1 is calculated. As described above, steps S31, S32, and S33 are carried out only once for each of parasitic resistance networks Net1 and Net2, resulting in reduced analysis time. The process from step S31 to step S38 is implemented similarly regarding the parasitic resistance network Net2. Next, the internodal voltages between the entry nodes and exit nodes of the parasitic resistance networks Net1 and Net2 along each of the shortest paths P, Q, R is extracted based on the node pair table. The extracted internodal voltage values and the clamped voltages of the protective elements along each of the shortest paths P, Q, R are summed and a inter-pad voltage is calculated for each the shortest paths P, Q, R.

Figures 48, 49, 50:
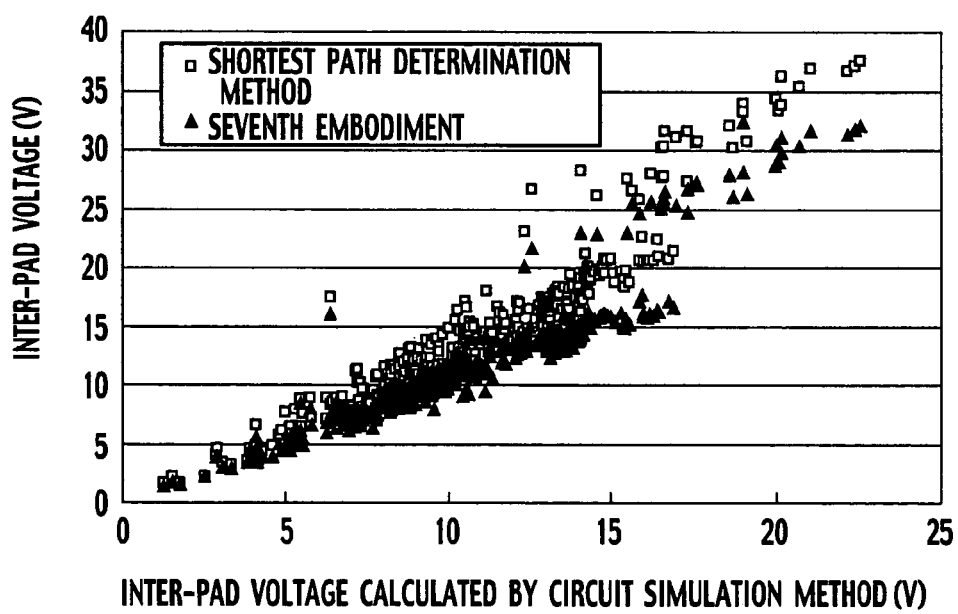
FIG. 48 is a table showing processing times required for implementation of an internodal voltage analysis method of the seventh embodiment.
FIG. 49 is a graph showing the relationship between the inter-pad voltages calculated using the circuit simulation method and corresponding inter-pad voltages calculated using the analysis method of the seventh embodiment.
FIG. 50 is a table showing processing times required for implementation of the inter-pad voltage analysis method of the seventh embodiment.

As described above, internodal voltages of all node pairs recorded in the node pair table are calculated at the same time using the circuit simulator for each of parasitic resistor nets Net1 and Net2. Steps S31, S32, and S33 should be carried out only once for each of parasitic resistor nets Net1 and Net2, resulting in considerable reduction in analysis time. As shown in FIG. 48, analysis time for calculating the internodal voltages of the multiple node pairs in the case of the parasitic resistor net including 41212 nodes is considerably reduced in the seventh embodiment in comparison with the case of repeating the circuit simulation method for each node pair.

As shown in FIG. 49, five hundred pad pairs were randomly selected. It is apparent that the inter-pad voltage calculated using the analysis method of the seventh embodiment is closer to the inter-pad voltage calculated using the circuit simulation method of the comparative example than inter-pad voltage calculated using the shortest path determination method of the comparative example. Therefore, it is assumed that the analysis accuracy according to the analysis method of the seventh embodiment is higher than that according to the shortest path determination method of the comparative example, and close to the analysis accuracy according to the circuit simulation method of the comparative example.

As shown in FIG. 50, it is apparent that the analysis time according to the analysis method of the seventh embodiment for three semiconductor LSI circuits mounted on three chips does not considerably increase compared to the analysis time according to the shortest path determination method of the comparative example. Therefore, the analysis time according to the analysis method of the seventh embodiment is equal to analysis time according to the shortest path determination method of the comparative example. It is assumed that with the analysis speed of the seventh embodiment, all pad pairs can be analyzed.

The present invention may be embodied in other specific forms without departing from the spirit or essential characteristics thereof. The embodiments are therefore to be considered in all respects as illustrative and not restrictive, the scope of the present invention being indicated by the appended claims rather than by the foregoing description, and all changes which come within the meaning and range of equivalency of the claims are therefore intended to be embraced therein.

What is claimed is:

1. A computer implemented electrostatic discharge analysis method for a semiconductor integrated circuit, comprising:

extracting a plurality of pads from an input layout of the semiconductor integrated circuit;

extracting a plurality of nets electrically connected to the extracted pads;

extracting a plurality of protective elements electrically connected to the extracted nets;

forming connection nodes that connect the pads or the protective elements to the nets;

extracting for each net of the plurality of nets, distributed resistances distributed along a corresponding net;

connecting the distributed resistances to the connection nodes in place of the nets;

forming inter-resistance nodes between the distributed resistances; and calculating an inter-pad voltage when an electrostatic discharge current flows between the pads.

2. The method as claimed in claim 1, wherein calculating the inter-pad voltage comprises calculating the node potential of each of the inter-resistance nodes and the connection nodes when an electrostatic discharge current flows between the pads.

3. The method as claimed in claim 1, wherein calculating the inter-pad voltage comprises determining a shortest path that allows minimization of the inter-pad voltage when an electrostatic discharge current flows between the pads.

4. The method as claimed in claim 1, further comprising:
reducing for each net, a resistor net including the distributed resistances extracted from the nets.

5. The method as claimed in claim 1, further comprising:
generating first node information for calculating a first gate-to-source/drain voltage so as to allow retrieval of a gate node identifier of an inter-resistance node with almost the same potential as the gate potential of a transistor in the semiconductor integrated circuit and a source/drain node identifier of an inter-resistance node with almost the same potential as the source/drain potential of the transistor from a transistor identifier of the transistor;

retrieving the gate node identifier and the source/drain node identifier from the transistor identifier based on the first node information for calculating the first rate-to-source/drain voltage; and calculating the gate-to-source/drain voltage of the transistor from the difference between the node potential of the inter-resistance node of the gate node identifier and the node potential of the inter-resistance node of the source/drain node identifier.

6. The method as claimed in claim 5, further comprising:
generating second node information for calculating a second gate-to-source/drain voltage so as to allow retrieval of a function of the connection node potential allowing calculation of the inter-resistance node potential from the gate node identifier or the source/drain node identifier;

retrieving the function from the gate node identifier or the source/drain node identifier based on the second node information for calculating the second rate-to-source/drain voltage; and calculating the inter-resistance node potential by substituting a detected function with the connection node potential.

7. The method as claimed in claim 1, further comprising:
displaying the layout; and
showing a display that allows identification of the magnitude of the gate-to-source/drain voltage at a position of a transistor in the layout.

8. The method as claimed in claim 1, further comprising:
determining whether an electrostatic discharge path exists between the pads.

9. The method as claimed in claim 8, further comprising:
forming an electrostatic discharge path between the pads lacking the electrostatic discharge path by connecting the protective elements.

10. The method as claimed in claim 1, further comprising:
providing identifiers of the pads on an X axis and a Y axis of XY coordinates; and
displaying an identifier indicating a range in which the inter-pad voltage between a starting point pad and an endpoint pad falls when applying the electrostatic discharge from the starting point pad of an identifier assigned to an x value along the X axis to the endpoint pad of an identifier assigned to a y value along the Y axis, at the position corresponding to the x value along the X axis and the y value along the Y axis of the XY coordinates.

11. A computer implemented electrostatic discharge analysis method for a semiconductor integrated, comprising:
extracting a plurality of pads from an input layout of the semiconductor integrated circuit;
extracting a plurality of nets electrically connected to the extracted pads;
extracting a plurality of protective elements electrically connected to the extracted nets;
forming connection nodes that connect the pads or the protective elements to the nets;
extracting for each net of the plurality of nets, distributed resistances distributed along a corresponding net;
connecting the distributed resistances to the connection nodes in place of the nets;
forming inter-resistance nodes between the distributed resistances;
determining a shortest path that allows minimization of the inter-pad voltage when an electrostatic discharge current flows between the pads;
removing the protective elements that are not along the shortest path;
disconnecting a circuit between the connection nodes connected to the removed protective elements; and
calculating the node potential of each of the connection nodes and the inter-resistance nodes when the electrostatic discharge current flows between the pads by using the node potential to calculate inter-pad voltage when the electrostatic discharge current flows between the pads.

12. A computer implemented electrostatic discharge analysis method for a semiconductor integrated circuit, comprising:
extracting a plurality of pads from an input layout of the semiconductor integrated circuit;
extracting a plurality of nets electrically connected to the extracted pads;
extracting a plurality of protective elements electrically connected to the extracted nets;
forming connection nodes that connect the pads or the protective elements to the nets;
extracting for each net of the plurality of nets, distributed resistances distributed along a corresponding net;
connecting the distributed resistances to the connection nodes in place of the nets;
forming inter-resistance nodes between the distributed resistances;
determining a shortest path that allows minimization of the inter-pad voltage when an electrostatic discharge current flows between the pads;
calculating internodal voltages for each net Through which the shortest path passes when the electrostatic discharge current flows between the connection nodes along the shortest path based on the distributed resistances;
calculating protective element voltages applied to the protective elements for each protective element along the shortest path when the electrostatic discharge current flows thereto; and
calculating an inter-pad voltage when the electrostatic discharge current flows between the pads by summing the internodal voltages and the protective element voltages.

13. The method as claimed in claim 12, wherein calculating the internodal voltages comprises:
generating a node pair table that allows extraction of the connection nodes along the shortest path via each net;
establishing a nodal equation for each net;
carrying out LU factorization of a coefficient matrix of the nodal equation;
extracting the connection nodes from each net using the node pair table;
setting a current vector for the nodal equation when an the electrostatic discharge current flows between the extracted connection nodes;
calculating a potential vector from the nodal equation by carrying out forward substitution and backward substitution of the nodal equation using the current vector and the LU factorized coefficient matrix; and
calculating the potential difference between the extracted connection nodes based on the potential vector.

* * * * *